(12) United States Patent
Tanaka et al.

(10) Patent No.: US 7,341,898 B2
(45) Date of Patent: Mar. 11, 2008

(54) THIN FILM TRANSISTOR CIRCUIT DEVICE, PRODUCTION METHOD THEREOF AND LIQUID CRYSTAL DISPLAY USING THE THIN FILM TRANSISTOR CIRCUIT DEVICE

(75) Inventors: Hiroaki Tanaka, Kanagawa (JP); Kyounei Yasuda, Kanagawa (JP); Seiji Suzuki, Kanagawa (JP)

(73) Assignee: NEC LCD Technologies, Ltd., Kawasaki (JP)

( * ) Notice: Subject to any disclaimer, the term of this patent is extended or adjusted under 35 U.S.C. 154(b) by 147 days.

(21) Appl. No.: 11/384,342

(22) Filed: Mar. 21, 2006

(65) Prior Publication Data
US 2006/0175611 A1    Aug. 10, 2006

Related U.S. Application Data

(62) Division of application No. 10/895,404, filed on Jul. 21, 2004, now Pat. No. 7,105,896.

(30) Foreign Application Priority Data

Jul. 22, 2003  (JP)  ............................. 2003-277459
Jul. 21, 2004  (JP)  ............................. 2004-212977

(51) Int. Cl.
    *H01L 21/84*      (2006.01)
(52) U.S. Cl. ............................. 438/158; 257/E21.561; 438/685
(58) Field of Classification Search ................ 438/685; 257/E21.561
    See application file for complete search history.

(56) References Cited

U.S. PATENT DOCUMENTS 5,530,573 A    6/1996  Shimada
5,585,290 A *  12/1996 Yamamoto et al. ......... 438/155
6,188,176 B1   2/2001  Nakaya et al.
6,433,842 B1   8/2002  Kaneko et al.

FOREIGN PATENT DOCUMENTS

JP    9-26598       1/1997
JP    2000-284326   10/2000

OTHER PUBLICATIONS

Chinese Office Action dated Mar. 2, 2007, with English-Language translation.
Korean Office Action dated Feb. 13, 2006; with partial English translation.

* cited by examiner

*Primary Examiner*—Richard A. Booth
(74) *Attorney, Agent, or Firm*—McGinn IP Law Group, PLLC

(57) ABSTRACT

A thin film transistor circuit device and the production method thereof is demanded for a thin film transistor circuit device, which contains wiring having a structure of an aluminum alloy in a lower layer and a molybdenum alloy in an upper layer, wherein corrosion in air of the molybdenum alloy does not proceed easily. A thin film transistor circuit device which exposes a portion of wiring covered with an insulating film that connects thin film transistors of a main circuit region formed on a center portion of a substrate to a protection circuit region formed on an outer periphery of the substrate, which contains on the exposed surface a terminal which is formed of terminal electrode metal, wherein an uppermost surface of the wiring is a molybdenum alloy comprising niobium.

3 Claims, 30 Drawing Sheets

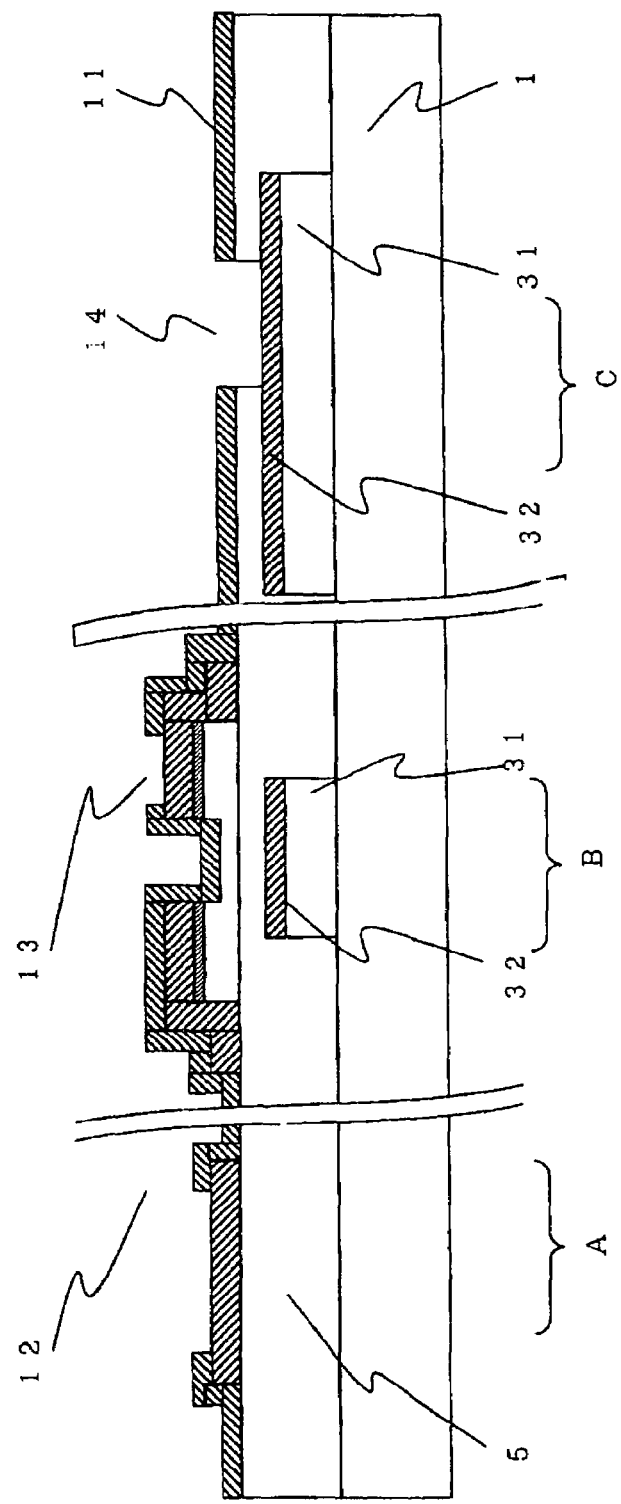

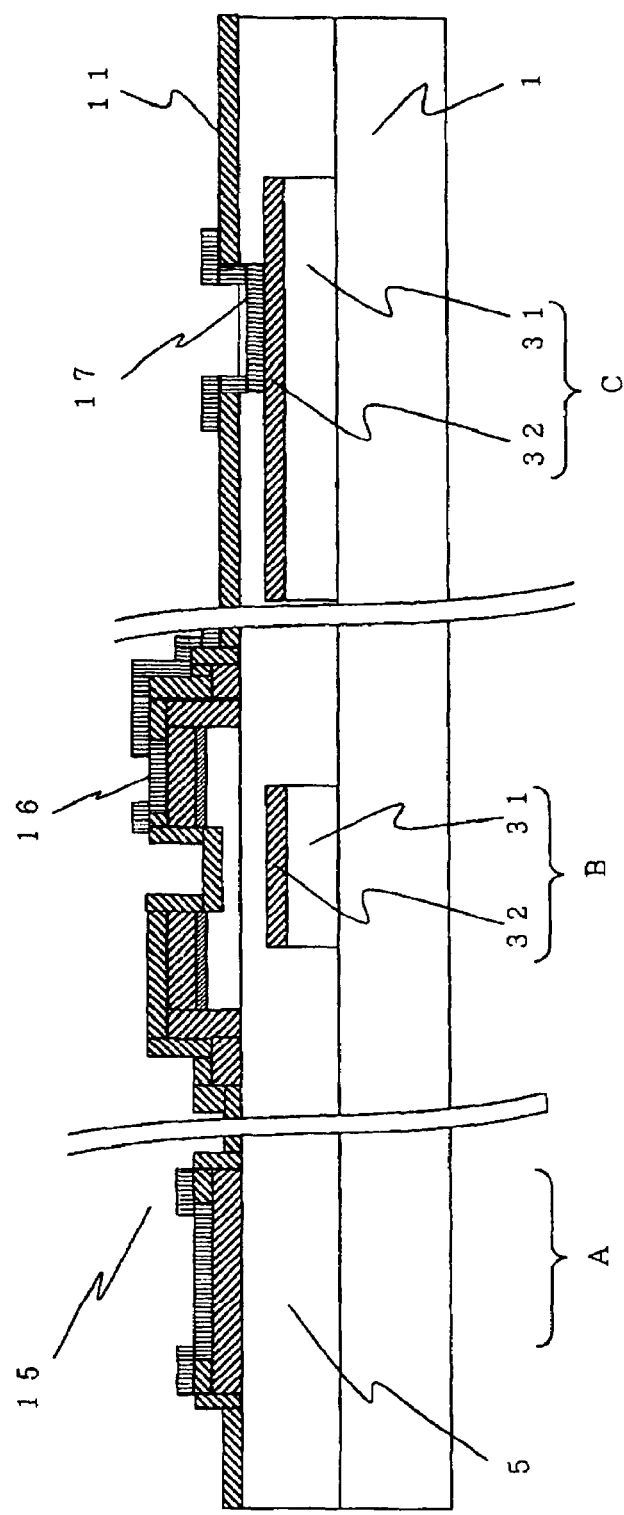

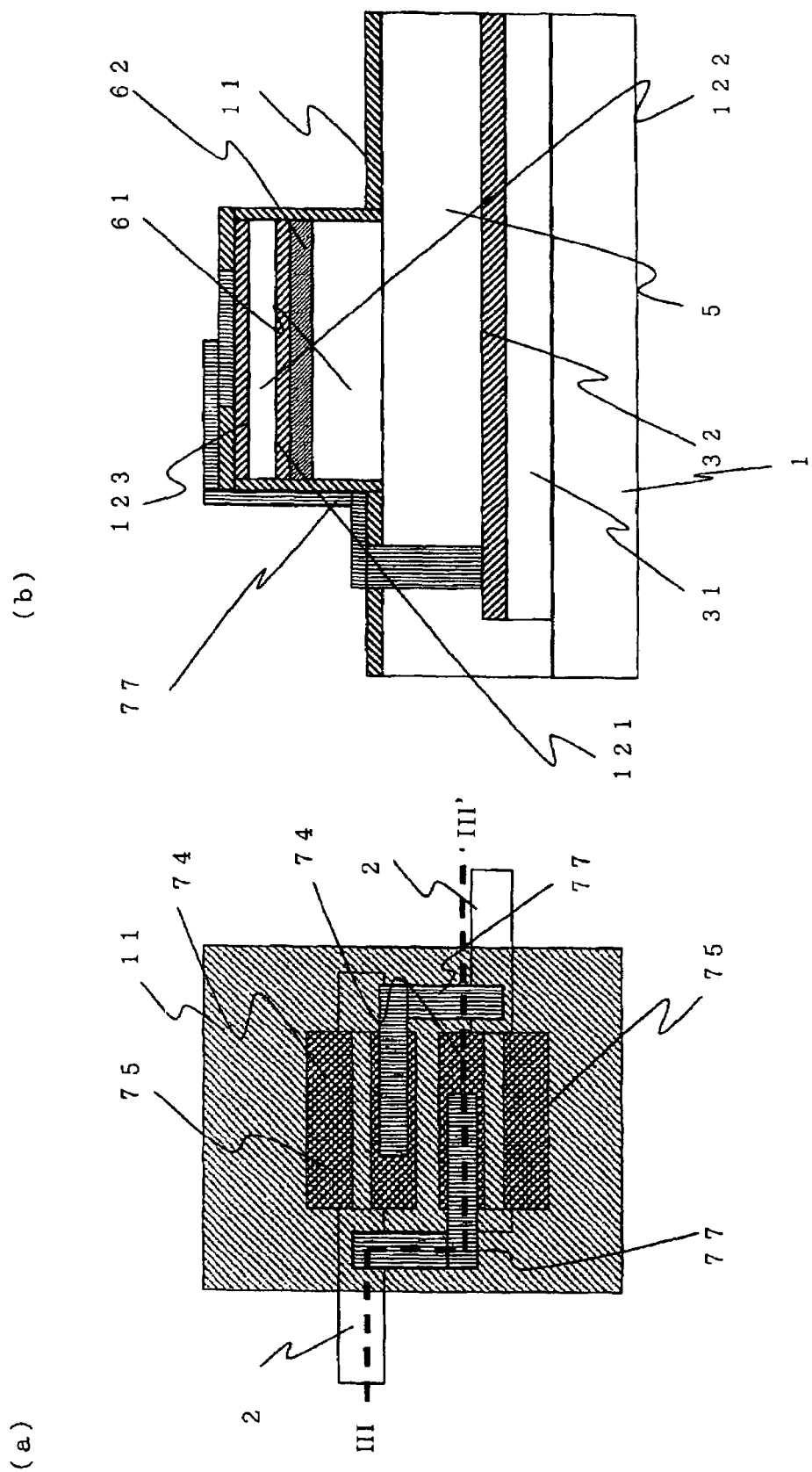

THIN FILM TRANSISTOR CIRCUIT DEVICE, PRODUCTION METHOD THEREOF AND LIQUID CRYSTAL DISPLAY USING THE THIN FILM TRANSISTOR CIRCUIT DEVICE

The present application is a Divisional application of U.S. patent application Ser. No. 10/895,404, filed on Jul. 21, 2004 now U.S. Pat. No. 7,105,896.

FIELD OF THE INVENTION

The present invention relates to a thin film transistor circuit device, a production method thereof and a liquid crystal display that uses the thin film transistor circuit device.

DESCRIPTION OF THE RELATED ART

Recently, thin film transistors (TFT) liquid crystal display is a mainstream of liquid crystal display and then thin film transistors were developed as a switching element for thin film transistor circuit devices, wherein improvements have been made that resulted from the TFT liquid crystal display being made larger and a pixel of the TFT liquid crystal display being made smaller. Apart from being merely switching elements for driving a pixel of the TFT liquid crystal display, thin film transistor circuit devices used in liquid crystal displays are now built onto the substrate as transistors for driver circuits for driving the liquid crystal and as transistors for electrostatic protection circuits.

The need, therefore, is becoming acute for wiring which can be used in connecting between electrodes of the thin film transistor circuit device transistors.

Conventionally, aluminum wiring, such as aluminum (Al) or an aluminum alloy, has been used to reduce wiring resistance in the wiring formed in a thin film transistor circuit device.

However, aluminum wiring suffers from the drawback that it tends to easily form hillocks from depending on its thermal history. Such hillocks have a tapered tip, whereby they can cause problems such as damaging the facing substrate. To resolve this problem, there is a laminated wiring method in which a refractory metal film is laminated onto the aluminum wiring. Japanese Patent Laid-Open No. 11-259016 discloses a technique for laminating a refractory metal (for example, molybdenum (Mo)) film onto aluminum wiring to prevent hillocks on aluminum wiring.

Japanese Patent Laid-Open No. 11-259016 discloses laminated wiring which employs an aluminum-neodymium (Al—Nd) alloy in a lower layer and a refractory metal in an upper layer. Japanese Patent Laid-Open No. 11-259016 discloses as the refractory metal one metal selected from the group consisting of Cr, Mo, W, Ti, Zr, Hf, V, Nb and Ta, or an alloy thereof.

The above-described laminated wiring is covered with a nitride film, so that when removing the nitride film by dry etching to expose the terminals, the etching selectivity of the nitride film and molybdenum alloy has to be raised to prevent the molybdenum alloy from being etched. Japanese Patent Laid-Open No. 2000-284326 discloses that the Mo—Nb etching rate can be made ¼ or less that of the nitride etching rate by adding to the molybdenum approximately 17 atom % (hereinafter, at %) or more of niobium (Nb).

However, molybdenum wiring is easily corroded by moisture in the air. Therefore, for molybdenum wiring, molybdenum corrosion tends to occur at the surface of the terminal portions that are exposed to air, making external connection reliability poor. In addition, when Cr, W, Ti, Zr, Hf, V, Nb or Ta is used as the refractory metal rather than molybdenum, wet etching of the aluminum alloy laminate is difficult, whereby the tapered shape of the gate wiring sides deteriorates, so that the drain and source wiring formed sandwiching the inter-layer insulating film on the upper layer of the gate wiring tends to disconnect.

In addition, Japanese Patent Laid-Open No. 2000-284326 discloses that it is preferable to add approximately 17 at % or more of niobium to molybdenum to raise the dry etching selection rate of the nitride covering the wiring and the molybdenum alloy constituting the upper layer of the wiring, because the molybdenum alloy etching rate can be lowered to ¼ or less of the nitride film etching rate. However, no insight is offered regarding the corrosion resistance of the molybdenum alloy.

It is an object of the present invention to increase the corrosion resistance of a molybdenum alloy in air for a thin film transistor circuit device comprising a wiring structure using a molybdenum alloy at least for the wiring.

SUMMARY OF THE INVENTION

The present invention is a thin film transistor circuit device which has a wiring of thin film transistors of a main circuit region formed on a center portion of a substrate extended in a direction toward a terminal formed on an outer periphery of the substrate, comprising on said terminal exposes a portion of a wiring covered with an insulating film and said exposed surface a terminal which is formed of terminal electrode metal, wherein at least said exposed surface of said wiring is a molybdenum alloy comprising niobium. Further, a niobium oxide layer is preferably formed on the surface of the molybdenum alloy comprising niobium of the uppermost surface.

The molybdenum alloy preferably contains niobium in a ratio of from 5 to 20 atom %.

The wiring may consist only of a molybdenum alloy layer comprising niobium. In addition, the wiring may be a laminated structure in which at least the uppermost layer is a molybdenum alloy layer comprising niobium, and a lower layer of the molybdenum alloy layer consists of a low resistance metal having a lower resistance than the molybdenum alloy layer. When the wiring is formed on a silicon film, a molybdenum alloy layer is preferably further formed on a lower layer.

The low resistance metal layer may use any of a metal having aluminum as a main constituent, a metal having copper as a main constituent or a metal having silver as a main constituent.

The metal having aluminum as a main constituent is preferably pure aluminum or an aluminum alloy comprising neodymium. The terminal electrode is preferably a transparent electrode, wherein ITO (Indium Tin Oxide), IZO (Indium Zinc Oxide) or IZTO (Indium Tin Zinc Oxide) can be used as the transparent electrode.

The present invention is also a thin film transistor circuit device comprising a thin film transistor and a wiring formed by a main circuit region formed on the center of a substrate and an outer circuit region formed on an outer periphery of the substrate; an insulating film that is formed on the electrode of the thin film transistor or the wiring; apertures formed on the insulating film, which expose at least a portion of the thin film transistor electrode or the wiring; and connection wiring which connects the apertures to the electrode or between apertures, wherein the metal which constitutes the thin film transistor electrode or wiring exposed by an aperture is a molybdenum alloy film comprising niobium.

Further, a niobium oxide layer is preferably formed on the surface of the molybdenum alloy comprising niobium exposed by the apertures.

The molybdenum alloy exposed by the apertures preferably contains niobium in a ratio of from 5 to 20 atom %.

In addition, the present invention is characterized in that the wiring or the thin film transistor electrode consists of only a molybdenum alloy layer comprising niobium. The wiring or the thin film transistor electrode may be a laminated structure in which at least the uppermost layer is a molybdenum alloy layer comprising niobium, and a lower layer of the molybdenum alloy layer consists of a low resistance metal having a lower resistance than the molybdenum alloy. The wiring or the thin film transistor electrode may also further have a molybdenum alloy layer formed on a lower layer.

The low resistance metal layer may be any of a metal having aluminum as a main constituent, a metal having copper as a main constituent or a metal having silver as a main constituent, wherein the metal having aluminum as a main constituent is preferably pure aluminum or an aluminum alloy comprising neodymium.

The electrode or the connection wiring is preferably a transparent electrode, wherein the transparent electrode is preferably ITO (Indium Tin Oxide), IZO (Indium Zinc Oxide) or IZTO (Indium Tin Zinc Oxide).

In addition, the present invention is a production method of a thin film transistor circuit device comprising a thin film transistor, which is formed by a main circuit region formed on a center portion of the substrate and an outer circuit region formed on an outer periphery of the substrate, and wiring, comprising an insulating film formation process for forming an insulating film on at least the thin film transistor electrode or wiring; an aperture formation process which exposes at least a portion of the thin film transistor electrode or the wiring of the lower layer that is formed on the insulating film for forming apertures; and a conductive film formation process for forming a conductive film which constitutes the wiring connecting the electrode to the aperture or between apertures, characterized in that the metal film which constitutes the thin film transistor electrode or wiring exposed by the apertures is a molybdenum alloy comprising niobium.

In addition, after formation of the apertures, an oxidizing process is preferable, in which the surface of the conductive film exposed by the apertures is oxidized.

During this time, the conductive film formation process and the oxidation process may also be sputtering with a metal under an oxygen-containing atmosphere.

In addition, the above-described thin film circuit device can be arranged with the formed substrate facing another substrate on which at least common wiring is formed, wherein a liquid crystal display is formed by sandwiching liquid crystals in the gap.

According to the present invention, incorporating from 5 to 20 at % of niobium in the molybdenum can achieve a marked improvement in corrosion resistance in air of the molybdenum alloy. Applying this wiring structure to drain wiring can achieve an increase in gate terminal/wiring and drain terminal/wiring reliability.

BRIEF DESCRIPTION OF THE DRAWINGS

FIG. 29 is a cross-sectional view that schematically illustrates a thin film transistor substrate showing the production process following on from FIG. 28;

FIG. 30 is a cross-sectional view that schematically illustrates a thin film transistor substrate showing the production process following on from FIG. 29; and FIGS. 31(a)-31(b) is a pattern diagram connecting thin film transistors according to the present invention.

Figure 1:
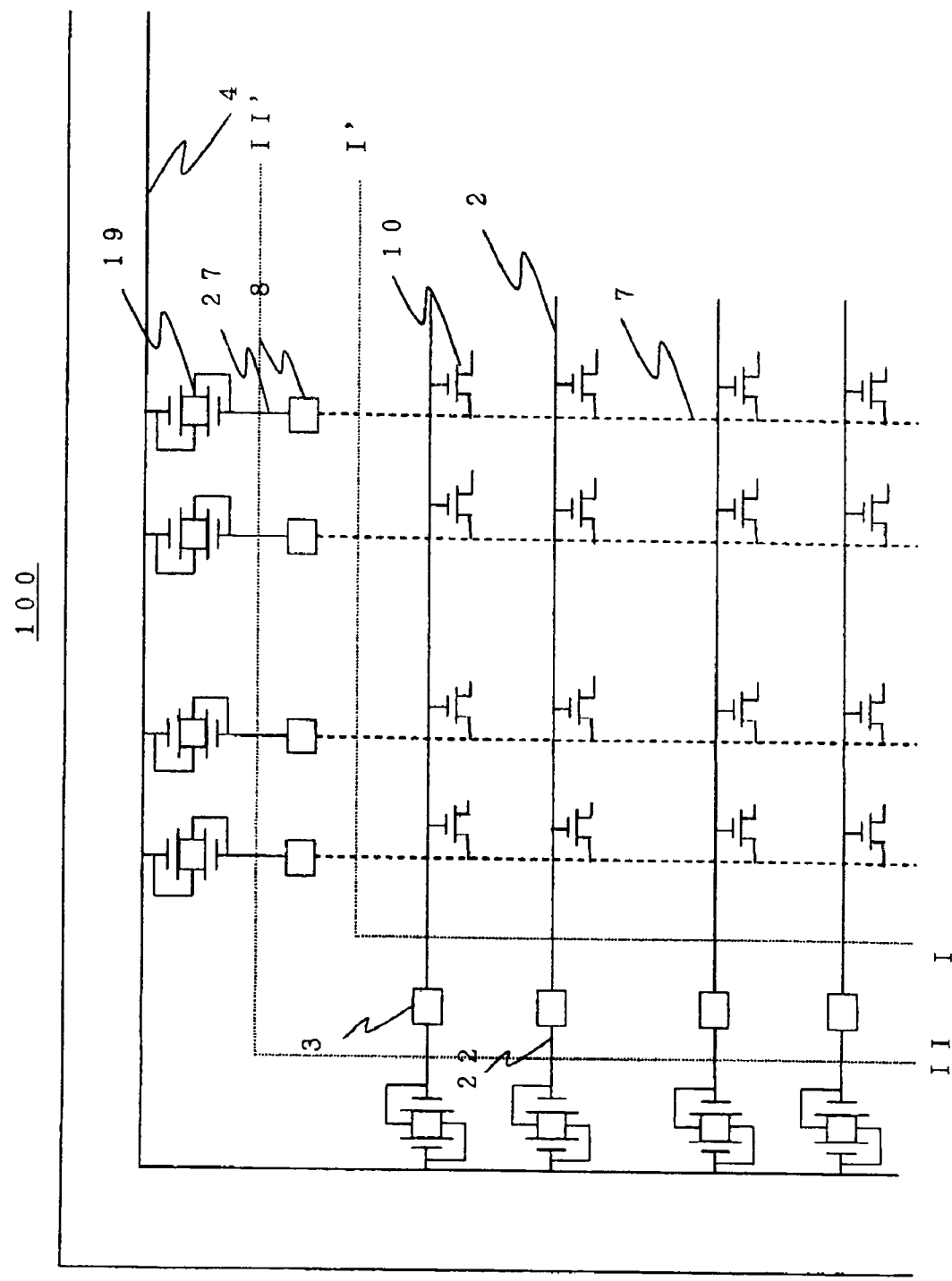
FIG. 1 is a partial plan view that schematically illustrates the internal circuitry of a thin film transistor substrate and the wiring in the terminal vicinity.

Reference numeral 1 denotes a transparent substrate, reference numeral 2 and 22 denotes a gate wiring, reference numeral 3 denotes a gate terminal, reference numeral 4 denotes an electrostatic protection circuit, reference numeral 5 denotes a nitride film, reference numeral 7 denotes drain wiring, reference numeral 8 denotes a drain terminal, reference numeral 10 denotes a thin film transistor, reference numeral 11 denotes a protection film, reference numerals 12, 13 and 14 denote respective apertures, reference numeral 15 denotes a drain terminal electrode, reference numeral 16 denotes a pixel electrode, reference numeral 17 denotes a drain terminal electrode, reference numeral 18 denotes a niobium oxide film, reference numeral 19 denotes an electrostatic protection element, reference numerals 31 and 122 denote respective aluminum alloy layers, reference numerals 32, 121 and 123 denote respective molybdenum alloy layers, reference numeral 70 denotes a chromium (Cr) film, reference numerals 57, 58, 59, 88, 89 and 90 denote respective resist patterns, reference numeral 61 denotes an amorphous silicon (a-Si) film, reference numeral 62 denotes a n$^+$ type a-Si film, reference numeral 73 denotes a drain terminal, reference numeral 74 denotes a drain electrode, reference numeral 75 denotes a source electrode and reference numeral 100 denotes a TFT circuit device.

DETAILED DESCRIPTION OF THE INVENTION AND PREFERRED EMBODIMENTS

It is an object of the present invention to increase the corrosion resistance of a molybdenum alloy in air for a thin film transistor circuit device comprising a wiring structure using a molybdenum alloy at least for the wiring. It is a further object of the invention to achieve an etching shape that is forward tapered shape when wet etching a laminated film consisting of at least a molybdenum alloy and aluminum or an aluminum alloy.

The thin film transistor circuit device according to the present invention comprises a first substrate; a gate wiring provided on the first substrate, which constitutes a gate terminal at an outer periphery of a display region; a first insulating film provided on the first substrate which covers the gate wiring; a semiconductor layer provided on the first insulating film, which serves as a thin film transistor active layer; a drain wiring which intersects the gate wiring and constitutes the drain terminal at an outer periphery of a display region; a second insulating film provided on the first insulating film which covers the drain wiring; a gate terminal electrode and a drain terminal electrode which respectively cover the gate terminal aperture and the drain terminal aperture, which are provided on the insulating film of the gate terminal and the drain terminal, characterized in that the gate wiring comprises, in order from the bottom, a low resistance metal and a molybdenum alloy which comprises niobium, wherein the low resistance metal has a lower resistance than the molybdenum alloy.

In the above-described thin film transistor circuit device, the source electrode is formed on the same layer as the drain wiring, the drain wiring and the source wiring are respectively connected to the semiconductor layer, wherein the drain wiring and the source wiring comprise, in order from the bottom, a molybdenum or a molybdenum alloy, a low resistance metal in the intermediate layer, and a molybdenum alloy which comprises niobium, and wherein the low resistance metal has a lower resistance than any of the molybdenum or molybdenum alloy in the lower layer, or the molybdenum alloy in the upper layer.

Contact holes are further provided on the second insulating film on the source electrode, wherein the pixel electrode which consists of the same material as that of the gate terminal electrode and the drain terminal electrode is connected to the source electrode via the contact holes.

In addition, providing niobium oxide between the upper layer molybdenum/niobium and the material which constitutes the gate terminal electrode and the drain terminal electrode allows connection reliability with the outside to improve.

In the above-described thin film transistor circuit device, the material which constitutes the gate terminal electrode and the drain terminal electrode is ITO (Indium Tin Oxide), IZO (Indium Zinc Oxide) or IZTO (Indium Tin Zinc Oxide).

In the thin film transistor circuit device, the low resistance metal is any of a metal having aluminum as a main constituent, a metal having copper as a main constituent or a metal having silver as a main constituent. Further, the metal having aluminum as a main constituent is preferably pure aluminum or an aluminum alloy comprising neodymium.

In addition, the production method of the thin film transistor circuit device according to the present invention is a production method of a thin film transistor substrate, which comprises a gate wiring formation process for forming a gate wiring on the first substrate which constitutes the gate terminal at an outer periphery of the display region; a first insulating film formation process for forming a first insulating film on the first substrate which covers the gate wiring; a semiconductor formation process for forming a thin film transistor semiconductor having a portion of the gate wiring on the first insulating film serve as the gate electrode; a drain wiring formation process for forming drain wiring which intersects the gate wiring on the first insulating film, and which constitutes the drain terminal at an outer periphery of the display region and connects to the semiconductor layer; a second insulating film formation process for forming a second insulating film on the first insulating film which covers the drain wiring; an aperture formation process for forming gate terminal apertures and drain terminal apertures on the insulating film of the gate terminal and drain terminal; and a terminal electrode formation process for respectively forming the gate terminal electrode and the drain terminal electrode which cover the gate terminal apertures and drain terminal apertures, characterized in that the gate wiring comprises, in order from the bottom, a low resistance metal and a molybdenum alloy comprising niobium, wherein the low resistance metal has a lower resistance than the molybdenum alloy.

In the above-described production method of a thin film transistor circuit device, in the drain wiring formation process, the drain wiring is formed. at the same time as the source electrode, the source wiring is connected to the semiconductor layer, and the drain wiring and the source wiring comprise, in order from the bottom, a molybdenum or a molybdenum alloy, a low resistance metal in the intermediate layer, and a molybdenum alloy which comprises niobium, wherein the low resistance metal has a lower resistance than either of the molybdenum or molybdenum alloy in the lower layer, or the molybdenum alloy in the upper layer.

In the above-described production method of a thin film transistor circuit device, in the terminal aperture formation process, contact holes are provided in the second insulating film on the source electrode, wherein the pixel electrode which consists of the same material as that of the gate terminal electrode and the drain terminal electrode is connected to the source electrode via the contact holes.

In addition, in the above-described production method of a thin film transistor circuit device, providing niobium oxide between the upper layer molybdenum/niobium and material which constitutes the gate terminal electrode and the drain terminal electrode allows the connection reliability with the outside to improve.

In the above-described production method of a thin film transistor circuit device, the material which constitutes the gate terminal electrode and the drain terminal electrode is ITO, IZO or IZTO.

In the above-described production method of a thin film transistor circuit device, the metal having aluminum as a main constituent is preferably pure aluminum or an aluminum alloy comprising neodymium.

The molybdenum alloy according to the present invention is an optimal molybdenum alloy when from 5 to 20 at % of niobium is incorporated in the molybdenum. When attempting to achieve an etching shape that is forward tapered during the course of wet etching the laminated film consisting of a molybdenum alloy and aluminum or an aluminum alloy, the etching rate ratio of the molybdenum alloy to the aluminum alloy is preferably from 1.5 to 0.5, and more preferably from 1.25 to 0.75. These conditions can be achieved by containing a Nb content of 5 to 15 at % in the molybdenum alloy, or a content of 5 to 10 at %. The etching rate ratio can also be adjusted by constituent adjustment of the phosphoric acid: nitric acid: acetic acid. When there is a particular need for putting priority on corrosion resistance, a Nb content of 20 at % in the molybdenum alloy is also possible.

To achieve a forward tapered etching shape, incorporating from 5 to 10 at % of Nb in the Mo is optimal, when placing preference on corrosion resistance incorporating from 10 to 15 at % of Nb in the Mo is optimal, and when placing particular preference on corrosion resistance, incorporating from 15 to 20 at % of Nb in the Mo is optimal.

Wiring using the molybdenum alloy according to the present invention is an optimal structure for wiring on the surface of thin film transistor circuit devices in which the structure of the terminal in which the surface is exposed is the same as that of the wiring connecting to that terminal. The wiring structure is preferably a molybdenum alloy monolayer structure wiring, or a multilayer structure wiring wherein the lower layer is an aluminum alloy and the upper layer a molybdenum alloy. When the base substance forming the wiring (a substrate or a film formed on a substrate) is a silicon substrate, a multilayer wiring structure is more preferable, wherein the lower layer is a molybdenum or a molybdenum alloy, the intermediate layer an aluminum alloy and the uppermost layer a molybdenum alloy.

The thin film transistor circuit device according to the present invention can arrange a first substrate to face, for example, a second substrate formed from common wiring, wherein a liquid crystal display is formed by sandwiching the liquid crystal in the gap.

EXAMPLES

Example 1

The substrate side on which liquid crystal display pixels are formed will now be explained as an example according to the present invention. FIG. 1 is a diagram which schematically shows a portion of the entire structure of a thin film transistor circuit device of the substrate side on which liquid crystal display pixels are formed. FIGS. 2 to 9 are process cross-sectional diagrams which schematically show a portion of the entire structure of a thin film transistor circuit device (TFT circuit device).

Needless to say, the present invention could also be applied to thin film transistor circuit devices other than liquid crystal displays.

As shown in FIG. 1, gate wiring 2 and gate terminals 3 are provided in a horizontal direction on a TFT circuit device 100, and an electrostatic protection wiring 4 is formed around the outermost periphery of the substrate. Gate wiring 2 passes through a gate terminal 3, wherein it becomes gate wiring 22 and connects to the electrostatic protection wiring 4 via an electrostatic protection element 19. Drain wiring 7 is arranged on the TFT circuit device 100 orthogonally to the gate wiring 2. Drain wiring 7 passes through a drain terminal 8, wherein it becomes drain wiring 27 and connects to the electrostatic protection wiring 4 via an electrostatic protection element 19. A thin film transistor 10 is provided in the region where gate wiring 2 and drain wiring 7 intersect. The gate terminal of the thin film transistor 10 is connected to the gate wiring, and the drain terminal of the thin film transistor 10 is connected to the drain wiring 7, whereby the source terminal is connected to the pixel electrode (not shown). The electrostatic protection element 19 is constituted from the same transistor structure as that of the thin film transistor 10.

In FIG. 1, the inner region bordered by the line I-I' is a main circuit region, wherein for a thin film transistor circuit device used in a liquid crystal display, this region becomes the display region.

The thin film transistor circuit device according to FIG. 1 forms the substrate of a liquid crystal display. The electrostatic protection element 19 is used in electrostatic protection during production of the thin film transistor circuit device, wherein the substrate is cut along the line II-II' during the process of producing the liquid crystal display. Although not shown in FIG. 1, in some cases a circuit such as an electrostatic protection circuit or a driver circuit is additionally formed between the gate terminal 3 and the drain terminal 4 and the display element region. These electrostatic protection circuits or driver circuits shall be collectively termed an outer circuit region. Similar to the electrostatic protection element 19, the thin film transistor formed in the circuit region is made from a transistor having the same structure as that of the thin film transistor 10 formed in the main circuit region.

FIGS. 2 to 12 are process cross-sectional diagrams schematically showing respective cross-sections of the drain wiring 7 and drain terminal 8, the thin film transistor 10, wiring 2 and gate 3 in the production process sequence of a thin film transistor circuit device. Each diagram is drawn in a sequence going from the left of the drain wiring and drain terminal formed region A; the thin film transistor formed region B; and the gate wiring and gate terminal formed region C.

Figure 2:
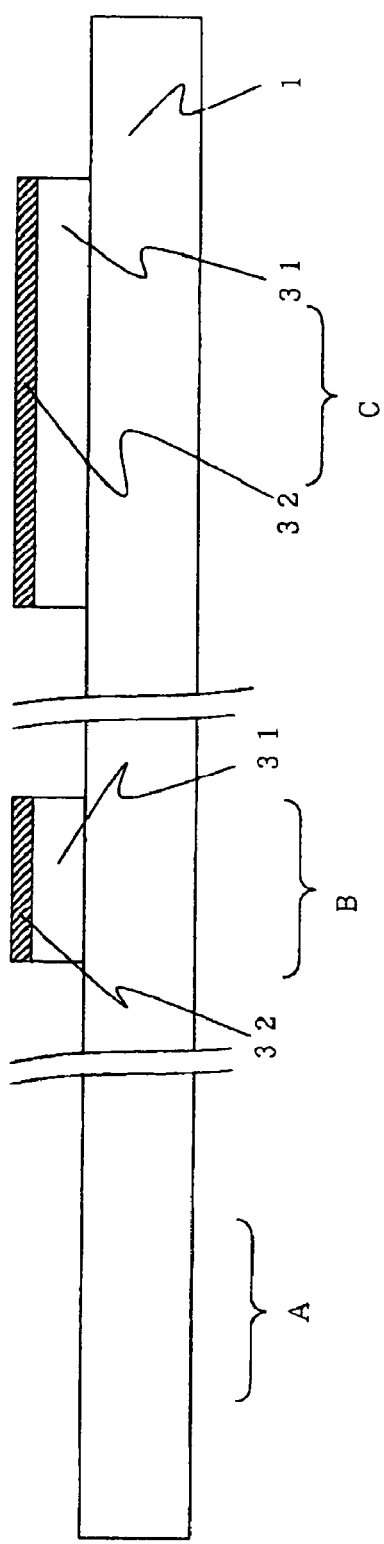
FIG. 2 is a cross-sectional view that schematically illustrates the respective cross-sections of the drain terminal, thin film transistor and gate terminal according to Example 1 that are shown in the production process sequence of a TFT substrate.

First, an aluminum alloy having a film thickness of from 200 to 400 nm Containing 2 at % neodymium and a molybdenum alloy having a film thickness of from 50 to 100 nm containing from 5 to 15 at % niobium were deposited in that order onto a transparent substrate 1 consisting of glass to form a laminated film, wherein the lower layer was an aluminum alloy and the upper layer was a molybdenum alloy. Gate wiring 2, gate terminal 3 and electrostatic protection wiring 4 (not shown) were formed (first Photolithographic Process) using a wet etching technique which employed a phosphoric acid:nitric acid:acetic acid etchant with a mask of a photoresist formed by ordinary photolithography of a laminated film. The gate wiring 2, gate terminal 3 and electrostatic protection wiring 4 (not shown) had a laminated structure in which the lower layer was an aluminum alloy layer 31 and the upper layer was molybdenum alloy layer 32 (FIG. 2).

As the glass employed for the transparent substrate, a heat resistant glass such as quartz is employed when forming a thin film transistor using a high-temperature polysilicon technique, while an alkaline or non-alkaline glass may be employed when using a low-temperature polysilicon technique or a amorphous silicon technique. Because the present embodiment is an example of forming a thin film transistor for a color TFT display device using a amorphous silicon technique, a non-alkaline glass was employed.

Figure 3:
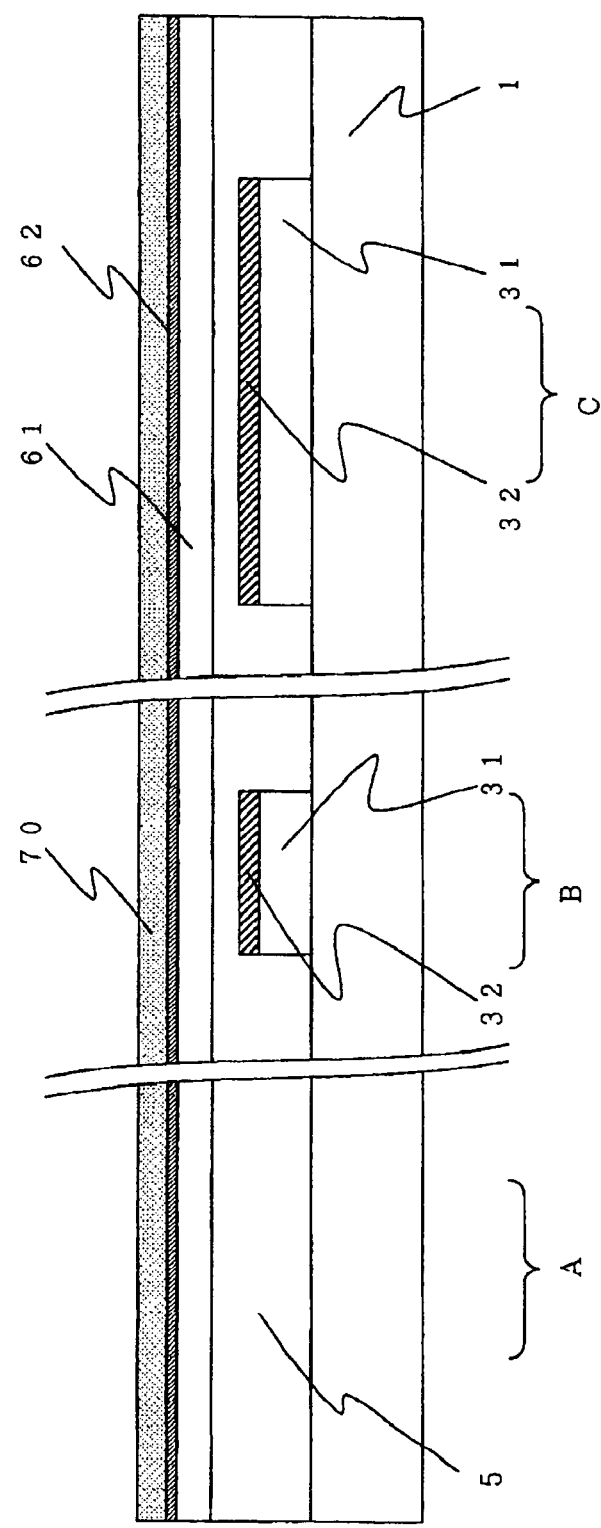
FIG. 3 is a cross-sectional view that schematically illustrates a thin film transistor substrate showing the production process following on from FIG. 2.

Next, a nitride film 5 having a film thickness of from 200 nm to 600 nm, an amorphous silicon film 61 (hereinafter, "a-Si") having a film thickness of from 100 nm to 300 nm, an $n^+$ type amorphous silicon film 62 (hereinafter, "$n^+$ type a-Si") having a film thickness of from 20 nm to 70 nm and a chromium (Cr) film 7 having a film thickness of from 200 nm to 500 nm were deposited in that sequence (FIG. 3).

An insulating film, such as a nitride film, oxynitride film, and oxide film, can be used as the nitride film 5, which serves as a gate insulator for the thin film transistor.

Next, resist patterns 58, 59 are formed by photolithography onto the Cr film 7 using a halftone mask. The resist pattern 58 is formed on a formed region A of the drain wiring including the drain terminal, and the resist pattern 59 is formed on a formed region B of the thin firm transistor.

During this procedure the resist patterns 58 and 59 are preferably formed using a halftone or a gray tone mask.

Except for the fully exposed portion and the shaded portion, the halftone or gray tone mask was a pattern having a semi-transmissive region corresponding to a channel region of the thin film transistor. As a result, the film thickness of the resist pattern 59 formed on the thin film transistor (hereinafter "TFT") formed region B had a film thickness of from 0.5 μm to 1.0 μm in the region formed by the thin film transistor channel, and a film thickness of from 1.5 μm to 2.0 μm in the other regions.

Figure 4:
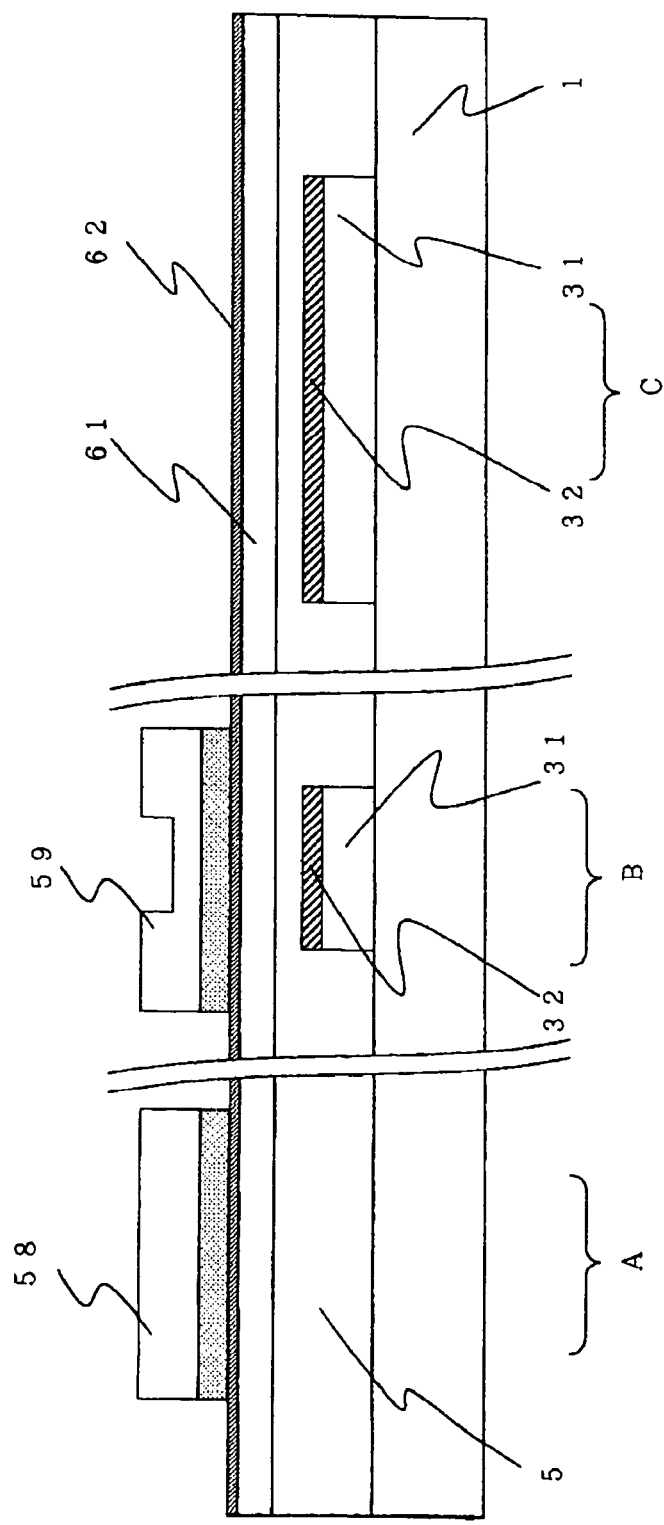
FIG. 4 is a cross-sectional view that schematically illustrates a thin film transistor substrate showing the production process following on from FIG. 3.

Next, with resist patterns 58, 59 as a mask, the Cr film 7 was removed by etching using a mixed solution of, for example, ceric ammonium nitrate and nitric acid (FIG. 4).

Figure 5:
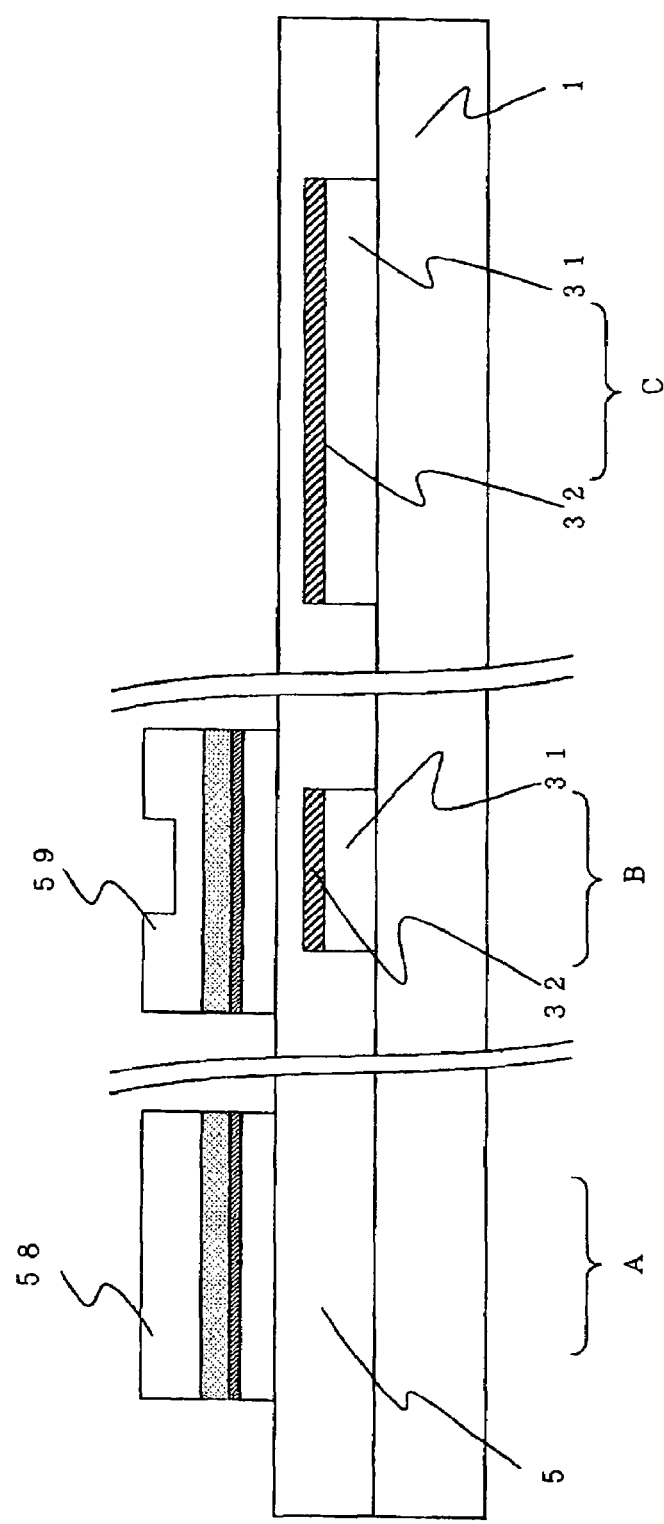
FIG. 5 is a cross-sectional view that schematically illustrates a thin film transistor substrate showing the production process following on from FIG. 4.

Next, with resist patterns 58, 59 as the mask, the $n^+$ type a-Si film 62 and the a-Si film 61 were successively removed by dry etching (FIG. 5).

Figure 6:
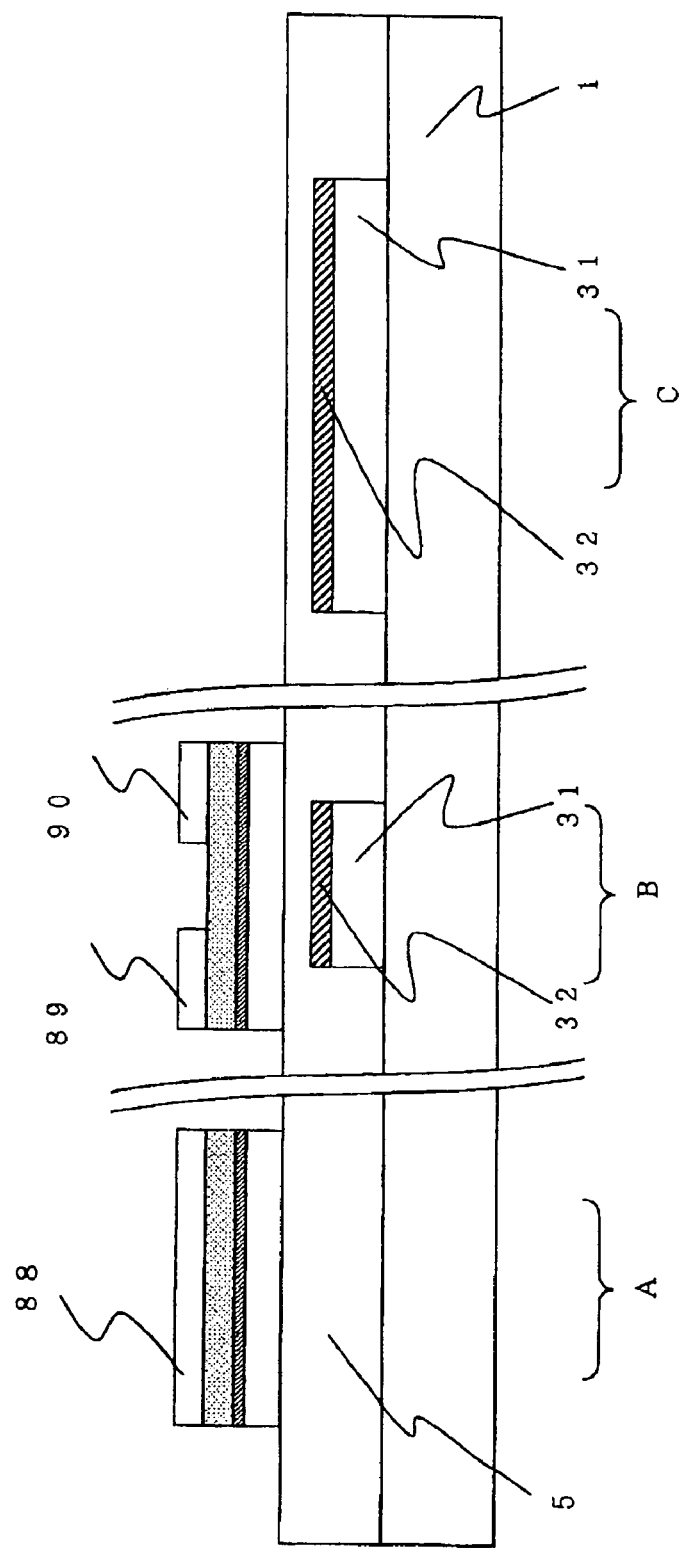
FIG. 6 is a cross-sectional view that schematically illustrates a thin film transistor substrate showing the production process following on from FIG. 5.

Next, resist patterns 58, 59 were etched in a thickness direction by oxygen plasma ashing only for the time it took to remove the thin portion corresponding to the thin film transistor channel region inside the resist pattern 59. Resist patterns 58, 59 were thus made into resist patterns 88, 89 and 90, each having a film thickness of from 0.5 μm to 1.0 μm (FIG. 6).

Figure 7:
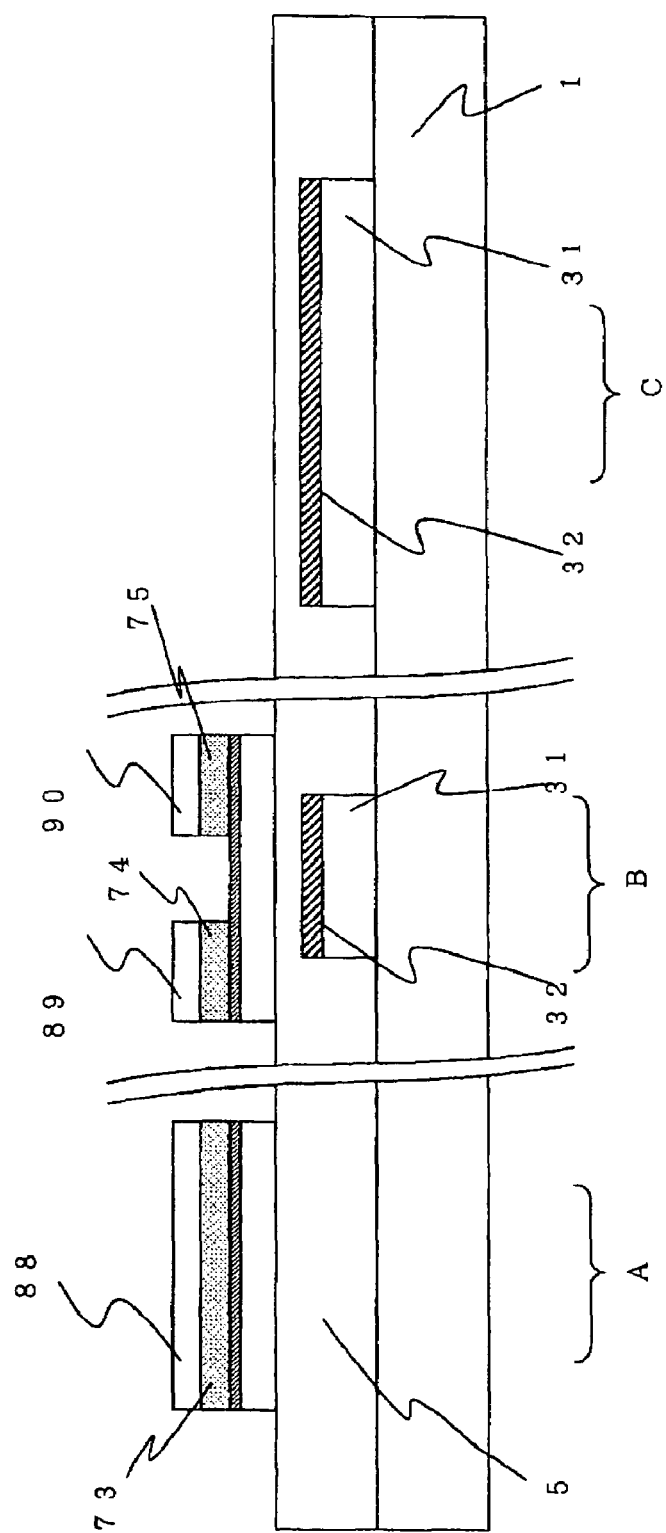
FIG. 7 is a cross-sectional view that schematically illustrates a thin film transistor substrate showing the production process following on from FIG. 6.

Next, the Cr film 7 was removed by selectively dry etching with resist patterns 88, 89 and 90 as a mask to form a drain terminal shaded electrode 73, a TFT drain electrode 74 and a source electrode 75 (FIG. 7).

Figure 8:
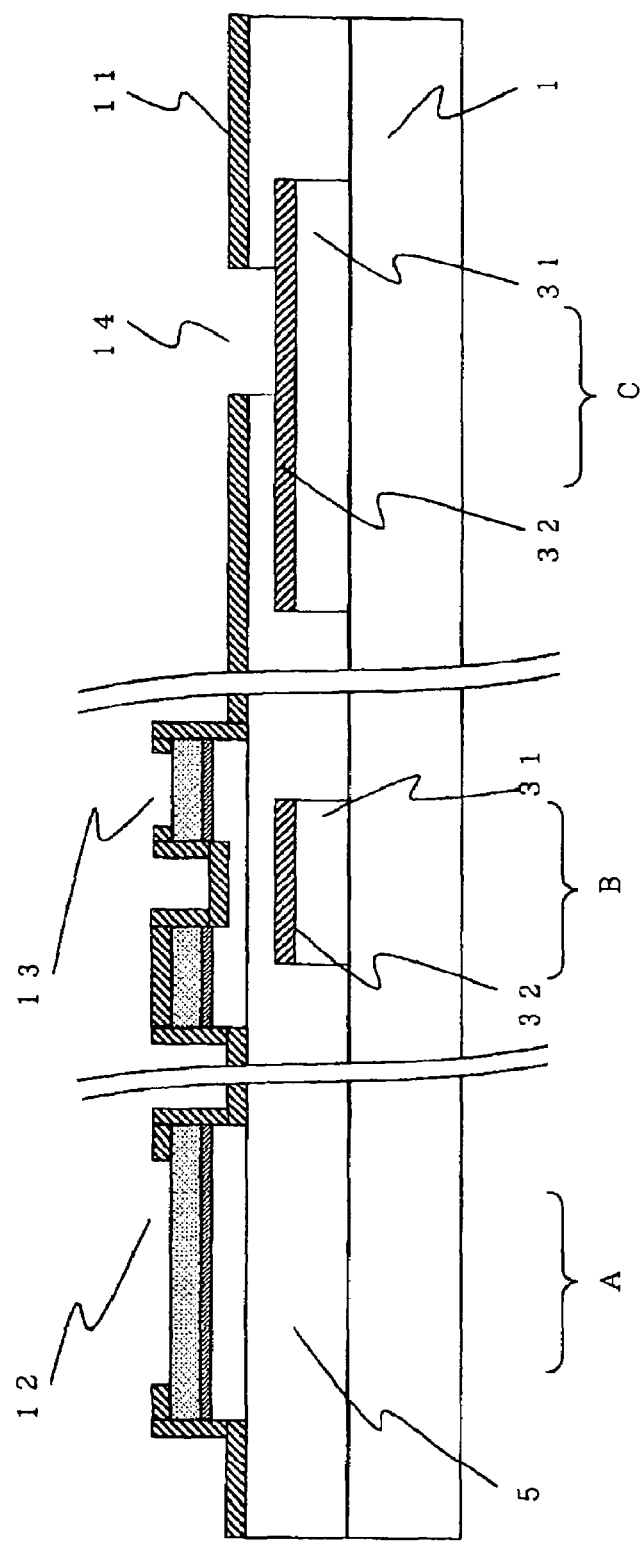
FIG. 8 is a cross-sectional view that schematically illustrates a thin film transistor substrate showing the production process following on from FIG. 7.

Next, once the resist patterns 88, 89 and 90 were removed, with the drain terminal 73, TFT drain electrode 74 and source electrode 75 as a mask, a portion of the $n^+$ type a-Si film 62 and a-Si film 61 of the channel region of the thin transistor 10 were then removed by etching using dry etching (second Photolithographic stage). Next, a protective film 11, consisting of a nitride film having a film thickness of from 100 to 300 nm, was formed on the substrate surface, and then using a photolithography process the drain terminal, the source electrode 75 of the thin film transistor 10 and the insulator film on the gate terminal were removed by etching to form apertures 12, 13 and 14. At this time, the apertures 12 and 13 corresponding to the drain terminal 8 and the source electrode 75 of the thin film transistor 10 were formed by the etching of the protective film 11, while the aperture 14 corresponding to the gate terminal 3 was formed by the etching of the protective film 11 and nitride film 5 (third Photolithographic process) (FIG. 8).

Needless to say, in addition to the nitride film, the protective film 11 could employ an insulator film made from an oxide film, an oxynitride film and the like.

Figure 9:
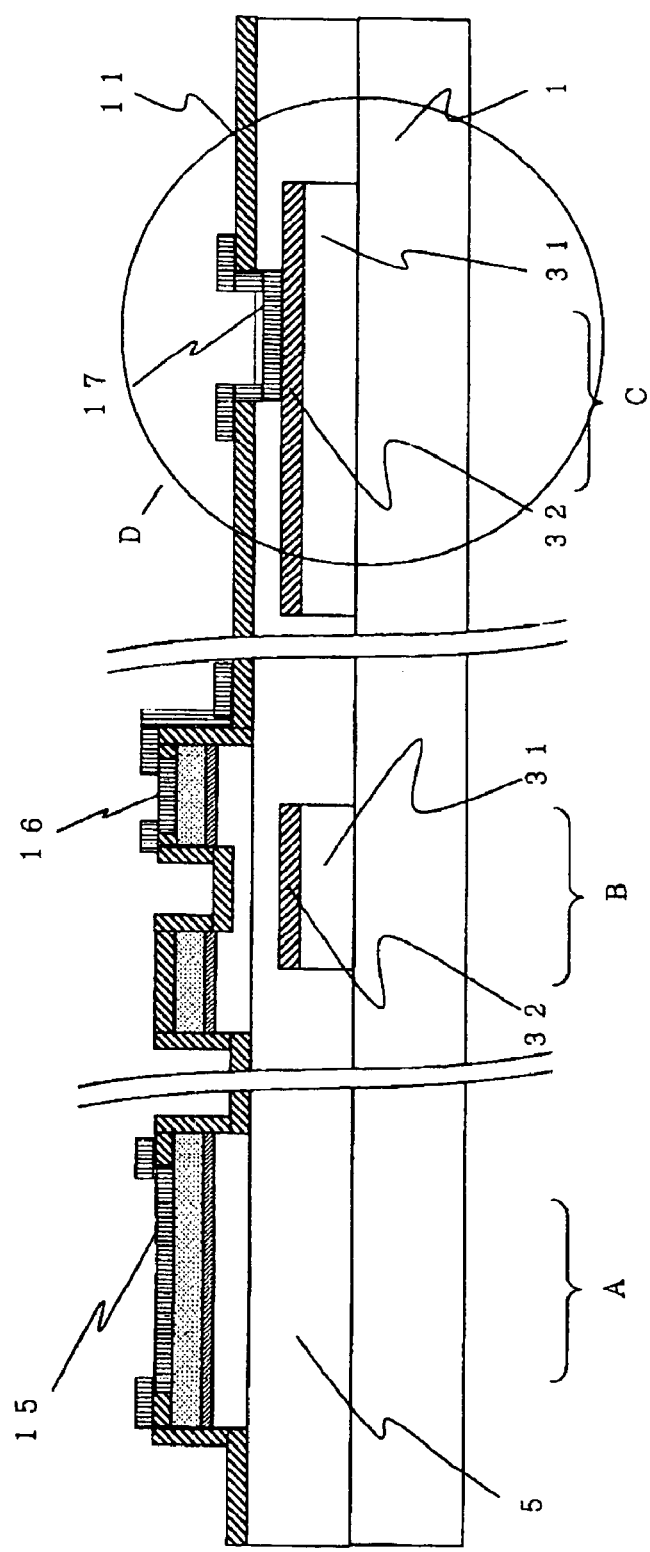
FIG. 9 is a cross-sectional view that schematically illustrates a thin film transistor substrate showing the production process following on from FIG. 8.

Finally, using a sputtering technique, an ITO (Indium Tin Oxide) film having a film thickness of from 30 to 100 nm was deposited, after which a photoresist pattern to serve as the etching mask was formed using a photolithography process. Next, the ITO film was patterned by dry etching to form a drain terminal electrode 15, a pixel electrode 16 and a gate terminal electrode 17 (fourth Photolithographic process) (FIG. 9).

The TFT circuit device was formed as described above. As shown in FIG. 9, the structure of the gate terminal 3 is, in sequence from the bottom, an aluminum alloy, a molybdenum alloy and ITO, wherein the Nb content of the molybdenum alloy is preferably from 5 to 20 at % (atomic weight ratio).

Further, even if IZO (Indium Zinc Oxide) or IZTO (Indium Tin Zinc Oxide) are used in place of ITO the same effect can be achieved.

Sandwiching a Mo alloy in between the ITO, IZO or IZTO and the aluminum alloy prevents galvanic action that occurs between the ITO, IZO or IZTO and the Al, and lowers the contact resistance with the ITO, IZO or IZTO. However, ITO, IZO or IZTO easily allow moisture to pass through, so that even for a structure in which the Mo alloy is covered by ITO, IZO or IZTO, a moisture-proof Mo alloy is required. Here, the remarkable effects of containing 5 to 20 at % of Nb in the Mo are explained using a graph.

Figure 10:
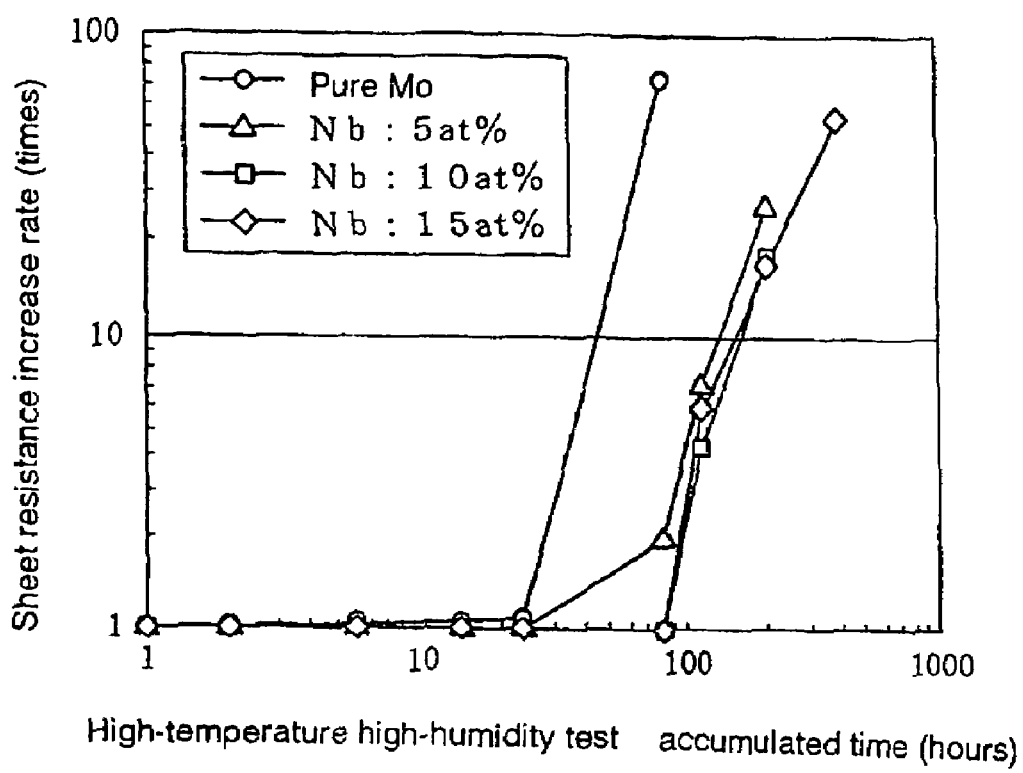
FIG. 10 illustrates the change over time in alloy resistance from a high-temperature high-humidity test when the ratio of Nb contained in a molybdenum alloy is varied.

FIG. 10 shows the change over time in alloy resistance from a high-temperature high-humidity test when the ratio of Nb in the molybdenum alloy was varied (both the horizontal axis and the vertical axis being logarithmic scale). For pure Mo that does not contain any Nb, alloy resistance begins to increase after 30 hours has passed. For alloys containing 5, 10, and 15 at %, although indications of an increase could be observed after 30 hours for the 5 at % content, for the 10 and 15 at % content alloys no changes in alloy resistance were observed whatsoever. An increase in resistance was observed for the 10 and 15 at % content alloys after approximately 100 hours had passed. Therefore, it was learnt for humidity resistance that the Nb content in the molybdenum alloy is preferably 5 at % or more and 10 at % or more is more preferable.

When the Nb content was more than 15 at %, the change in resistance was no different from that observed for contents of 10 at % or 15 at %.

Figure 11:
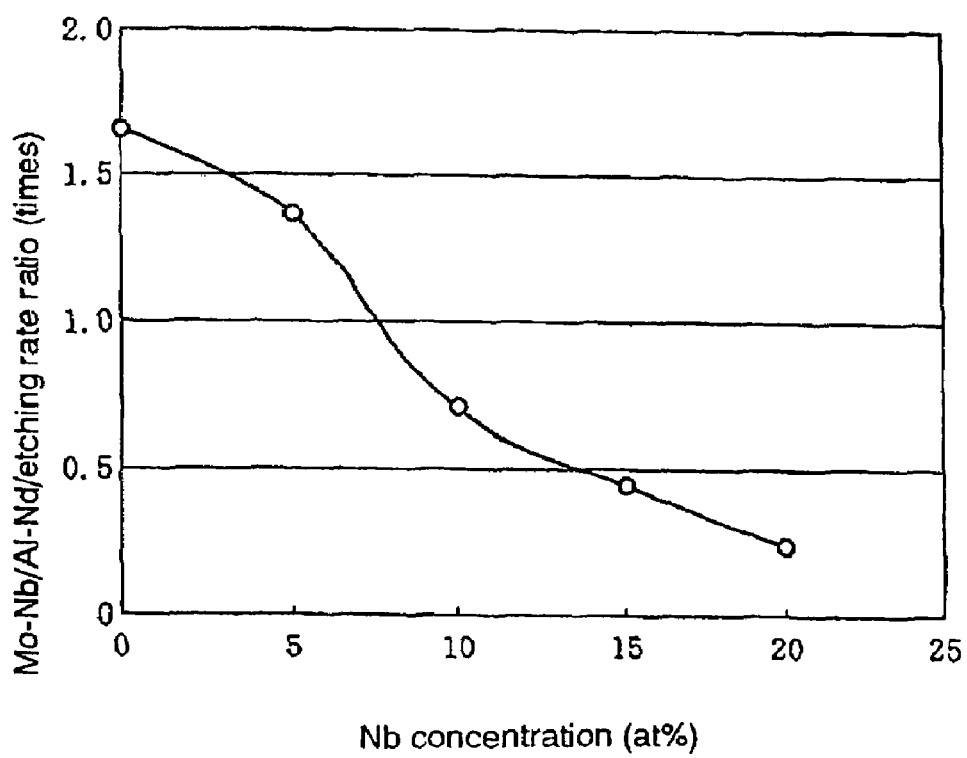
FIG. 11 shows the etching rate when wet etching a molybdenum alloy using phosphoric acid:nitric acid:acetic acid, illustrating change due to the ratio of Nb contained in the molybdenum alloy.

FIG. 11 shows the change due to the ratio of Nb contained in the molybdenum alloy on the molybdenum alloy and the aluminum alloy etching rate ratio when wet etching the molybdenum alloy using phosphoric acid:nitric acid:acetic acid. Ideally, because the laminated layer of molybdenum alloy and aluminum alloy is subjected to wet etching, to obtain a good etching shape the molybdenum alloy and aluminum alloy etching rates are preferably almost equal. Therefore, the molybdenum alloy and aluminum alloy etching rate ratio is preferably from 1.5 to 0.5, and more preferably from 1.25 to 0.75. Under these conditions, a Nb content of 5 to 15 at % in the molybdenum alloy, or a content of 5 to 10 at % can be achieved. The etching rate ratio can also be adjusted by constituent adjustment of the phosphoric acid:nitric acid:acetic acid. When there is a particular need for placing priority on corrosion resistance, a Nb content of 20 at % in the molybdenum alloy is also possible.

From the results of FIGS. 10 and 11, a Nb content of from 5 to 20 at % in the molybdenum alloy gives an optimal molybdenum alloy. For a liquid crystal display employing the present invention, a Nb content of from 5 to 10 at % in the Mo is optimal when giving preference to etching shape, while a Nb content of from 10 to 15 at % in the Mo is optimal when placing preference on corrosion resistance. When placing particular preference on corrosion resistance, a Nb content of from 15 to 20 at % in the Mo is optimal.

In the present example, because the structure of the display device was illustrated using the simplest structure, the gate wiring and drain wiring in the display device region were explained using a structure in which they were formed on the same layer. However, there are also cases when an electrostatic protection circuit is provided for protecting the transistors that constitute the display device and the driver circuit from static electricity applied to the gate terminal 3 and drain terminal 3, or when the structure of the pixel section is complex such as for an in-plane type, or when the gate electrode and gate wiring/drain electrode and drain wiring are built onto separate layers. FIG. 31 schematically shows an example of a case where the gate wiring for one thin film transistor is connected with the edge of another thin film transistor. FIG. 31(a) shows a plan view of such a structure, and FIG. 31(b) is a diagram showing a cross-section taken along the line III-III' of FIG. 31(a).

In FIG. 31(a), two thin film transistors are formed in parallel, wherein the gate wiring 2 of one of the thin film transistors is connected with one of the electrodes of the other thin film transistor, and the gate wiring of the other thin film transistor is connected with one of the electrodes of the first thin film transistor. FIG. 31(b) is a cross-sectional diagram taken along the line II-II' of FIG. 31(a). Laminated structure gate wiring of the aluminum alloy layer 31 and the molybdenum alloy layer 32 is formed on the substrate 1. On the gate wiring are formed a nitride film 5 to serve as a gate insulating film, the body of the thin film transistor, which is a laminated structure of an a-Si film 61 and $n^+$ type a-Si film 62, and the laminated electrode of the molybdenum alloy layer 121, aluminum alloy layer 122 and molybdenum alloy layer 123 formed on the body. A protective film 11 is formed so as to cover the entire surface, wherein a first aperture for exposing the electrode is formed on the protective film 11 on the electrode. Further, on the protective film 11 and the nitride film 5, a second aperture is formed for exposing the surface of the wiring. Connection wiring 77 is formed through the first aperture and the second aperture for connecting the gate wiring with the electrode.

Example 2

Figure 12:
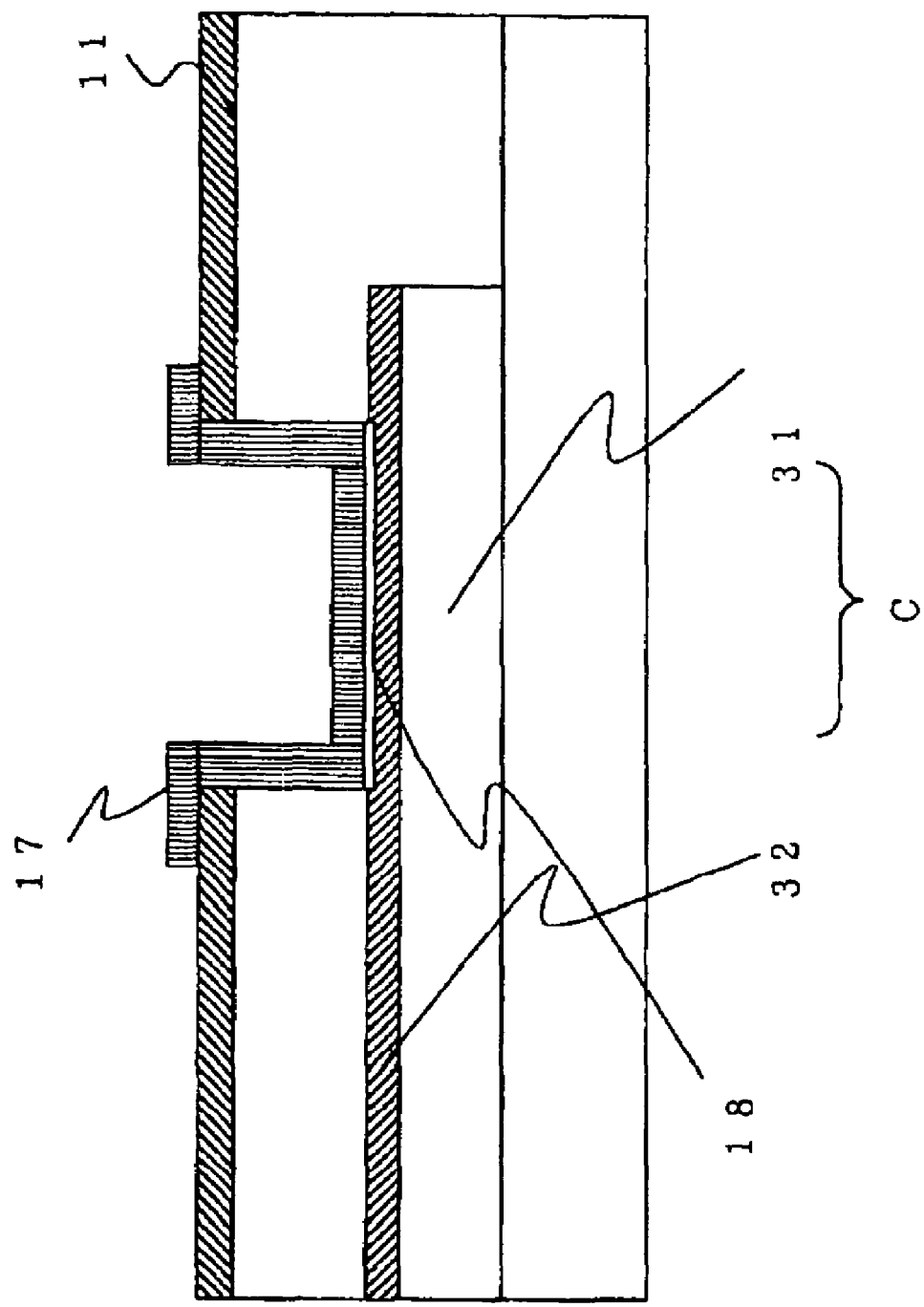
FIG. 12 is a cross-sectional view that schematically illustrates a gate terminal electrode on the thin film transistor substrate in accordance with Example 2 according to the present invention, in which a portion of the structure of the gate terminal electrode of Example 1 is modified.

Next, Example 2 according to the present invention will be illustrated in FIG. 12. FIG. 12 is an enlarged view of part D from FIG. 9, wherein a niobium oxide film 18 is formed at the interface of the gate terminal ITO and the molybdenum alloy.

The niobium oxide film 18 can be realized by the addition of oxygen ($O_2$) in argon (Ar) when sputter depositing the ITO.

In Example 2 the ITO was deposited to a thickness of from 30 nm to 100 nm.

A pressure of from 0.3 to 0.6 Pa, DC power of 1 to 2 KW, an $O_2$ flow of 0.1 to 2% of the Ar flow are preferable conditions, although depending on the apparatus other values may be more optimal. Needless to say, these conditions can be determined as appropriate.

Adding a small amount of $O_2$ to Ar allows a thin niobium oxide film 18 having a thickness of about 1 to 5 nm to form on the surface of the molybdenum alloy directly after sputtering start. Because the niobium oxide film is a non-moving substance, it acts as a barrier film and can hinder corrosion of the MO and the Al therebelow.

Needless to say, the niobium oxide film 18 can also be formed by sputtering the ITO after heating in an oxygen-containing atmosphere. When heating the substrate before sputtering the ITO, the niobium oxide film 18 can be formed without increasing the number of processes by adding air atmosphere or oxygen in argon without reducing the sputtering apparatus interior pressure, heating the substrate, then reducing the pressure and carrying out sputtering.

Example 3

Next, Example 3 according to the present invention will be explained using FIGS. 13 and 14. While in Example 1 the laminated structure, consisting of aluminum alloy and molybdenum alloy, was only applied to the gate wiring, in the present Example it was also applied to the drain wiring. In such a case, because the lower surface of the drain wiring is in contact with the amorphous silicon film, to prevent a eutectic reaction from occurring between the aluminum and the silicon film, a molybdenum alloy is provided under the aluminum alloy to give a three layered structure.

Although amorphous silicon is used as the silicon film in the present Example, needless to say single crystal or polycrystalline silicon would give the same results.

Figure 13:
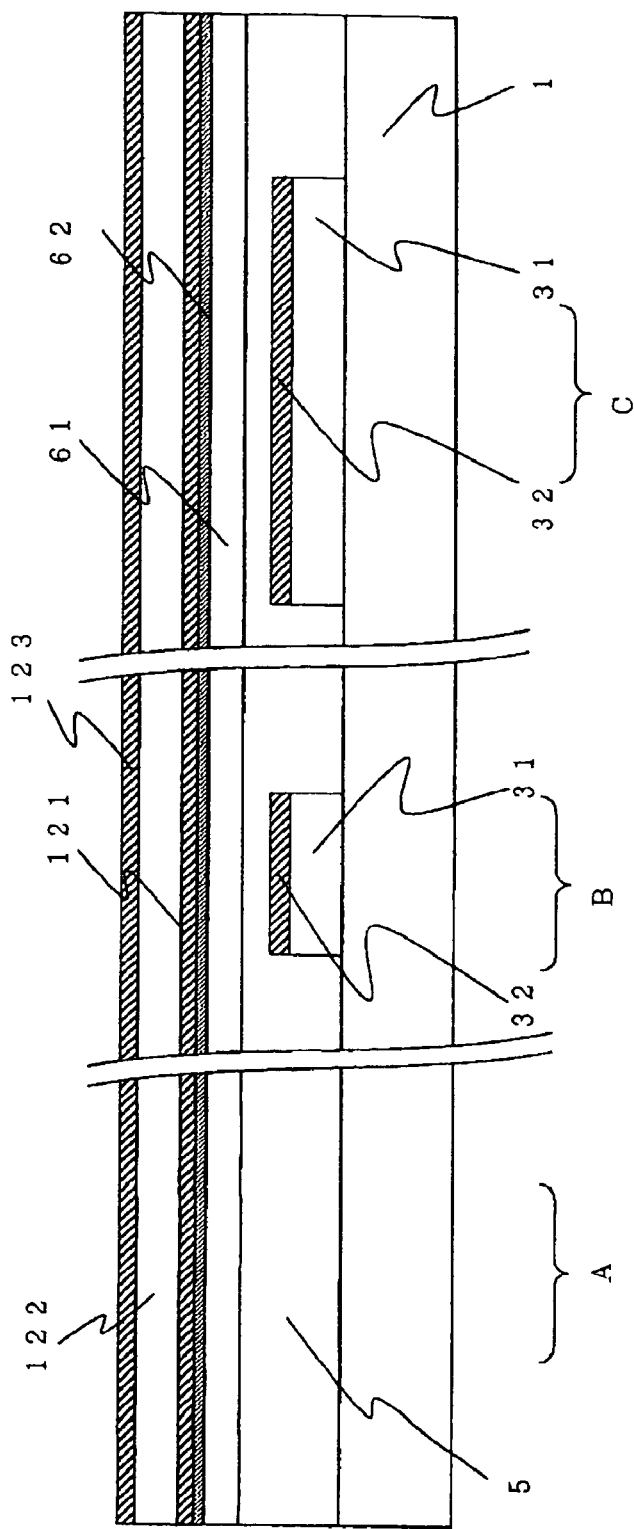
FIG. 13 is a cross-sectional view that schematically illustrates the respective cross-sections of the drain terminal, thin film transistor and gate terminal in accordance with Example 3 according to the present invention that are shown in the production process sequence of a TFT substrate.

While in FIG. 3 of Example 1 a Cr film 7 was deposited, in the present Example a molybdenum alloy film 121 having a film thickness of from 50 nm to 100 nm containing from 5 to 15 at % of niobium, an aluminum alloy film 122 having a film thickness of from 200 nm to 400 nm containing 2 at % of neodymium, and a molybdenum alloy film 123 having a film thickness of from 50 nm to 100 nm containing from 5 to 15 at % of niobium were deposited in that sequence (FIG. 13).

Next, in the same manner as FIG. 4, using a graytone mask on the molybdenum alloy film 123, a resist pattern was formed by photolithography onto each of a drain wiring formed region A, including the drain terminal, and a thin film transistor formed region B. As described in the explanation of FIG. 4, these resists are preferably formed using a halftone or graytone mask which makes the region corresponding to the thin film transistor channel region as a semi-transmissive region. In this Example as well, resist patterns were formed in which the film thickness of the region formed by the thin film transistor channel was from 0.5 µm to 1.0 µm, and a film thickness of from 1.5 µm to 2.0 µm in the other regions.

Next, with resist patterns 58, 59 as a mask, the molybdenum alloy film 121, aluminum alloy film 122 and molybdenum alloy film 123, which were not covered by the resist patterns, were etched by a wet etching technique using, for example, an phosphoric acid:nitric acid:acetic acid etchant.

After that, with resist patterns 58, 59 as a mask, the n⁺ type a-Si film 62 and the a-Si film 61 were removed by successive dry etching.

Next, in the same manner as FIG. 6, the resist patterns were etched in a thickness direction by oxygen plasma ashing only for the time it took to remove the thin portion corresponding to the thin film transistor channel region inside the resist patterns, whereby the resist patterns of the region forming the thin film transistor channel region were removed.

Next, in the same manner as FIG. 7, with the remaining resist patterns as a mask, the molybdenum alloy film 121, aluminum alloy film 122 and molybdenum alloy film 123 of the channel formed regions of the thin film transistor were removed by etching.

Next, in the same manner as FIG. 8, once the resist patterns were removed, with the drain terminal and source electrode as a mask, part of the n⁺ type a-Si film 62 and s-Si film 62 were removed in a thickness direction (second Photolithographic Process). Next, a protective film 11 consisting of a nitride film having a film thickness of from 100 to 300 nm was formed on the substrate surface, and then using a photolithography process the drain terminal, the source electrode of the thin film transistor 10 and the insulating film on the gate terminal were removed by etching to form apertures. At this time, the apertures corresponding to the drain terminal and the source electrode of the thin film transistor were formed by the etching of the protective film 11, while the aperture 14 corresponding to the gate terminal was formed by the etching of the protective film 11 and nitride film 5 (third Photolithographic Process).

Figure 14:
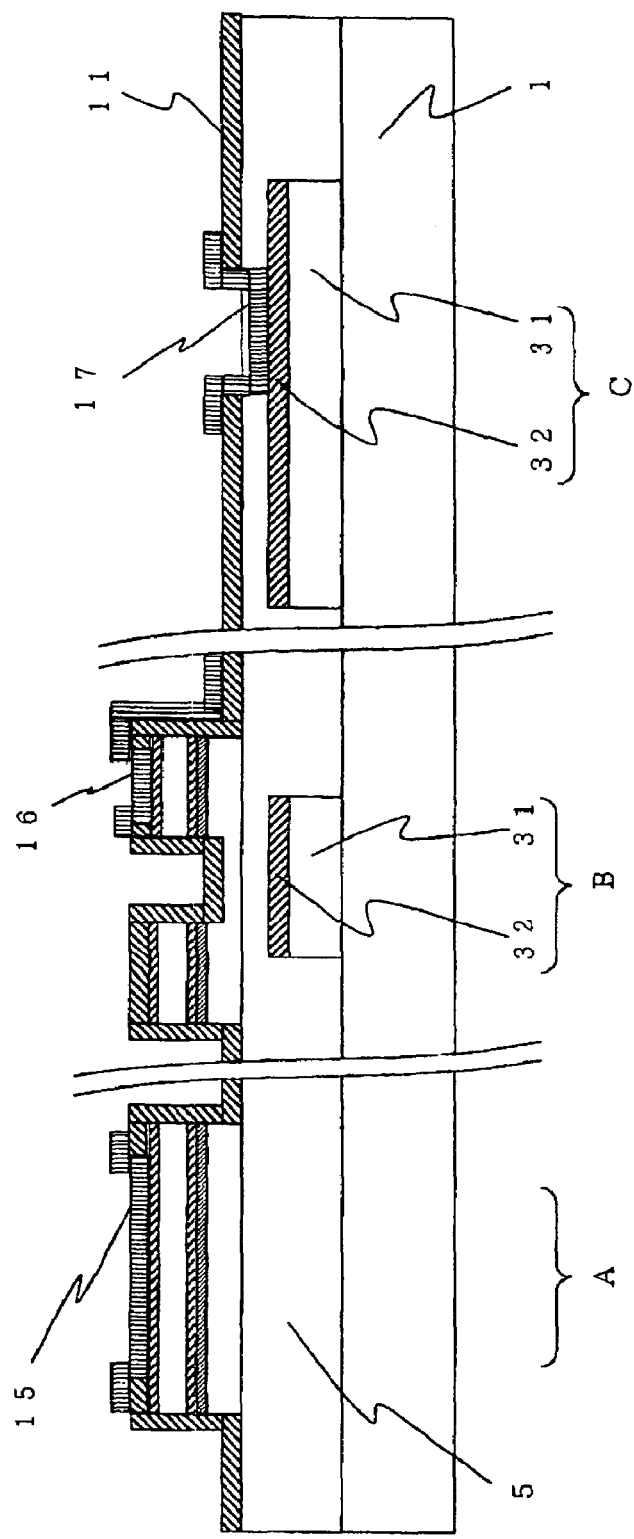
FIG. 14 is a cross-sectional view that schematically illustrates a thin film transistor substrate showing the production process following on from FIG. 13.
Figure 15:
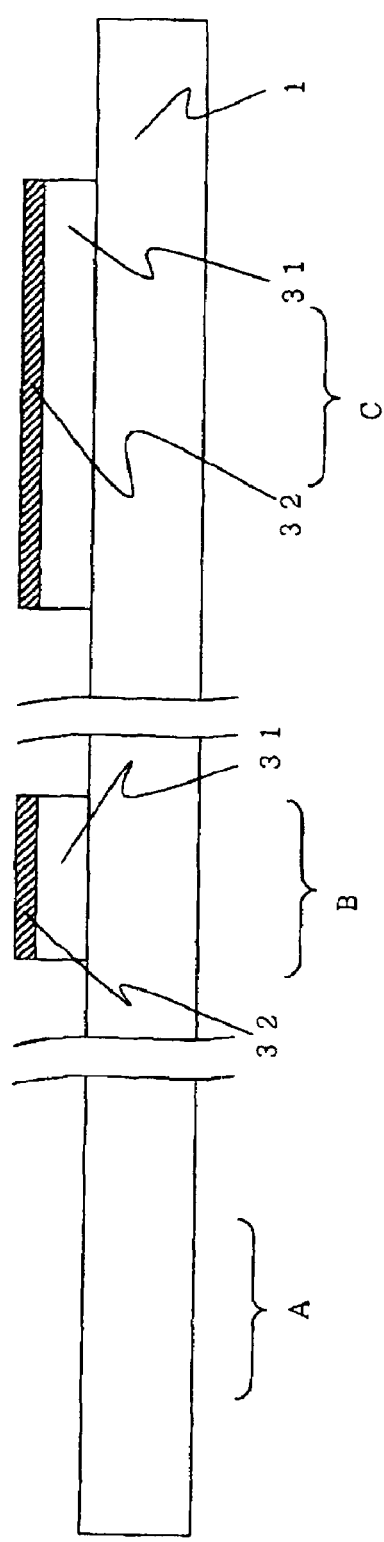
FIG. 15 is a cross-sectional view that schematically illustrates the respective cross-sections of the drain terminal, thin film transistor and gate terminal in accordance with Example 4 according to the present invention that are shown in the production process sequence of a TFT substrate.

Finally, using a sputtering technique, a transparent conductive film of ITO (Indium Tin Oxide) having a film thickness of from 30 to 100 nm was deposited, then patterned using a photolithography process to form a drain terminal electrode 15, a pixel electrode 16 and a gate terminal electrode 17 (fourth Photolithographic Process) (FIG. 14).

A TFT circuit device was thus formed in this way. As shown in FIG. 14, the structure of the drain wiring and terminal, the gate wiring and terminal, and the source and drain electrodes were, in sequence from the bottom, an molybdenum alloy, aluminum alloy, molybdenum alloy and ITO, wherein the Nb content of the molybdenum alloy is preferably from 5 to 20 at % (atomic weight ratio).

Example 4

FIGS. 15 to 22 are process cross-sectional diagrams that schematically show respective cross-sections of the grain terminal 8, thin film transistor 10 and the case terminal 3 according to the present example for the production process sequence of a TFT circuit device. In each diagram, a drain wiring and drain terminal formed region A, a thin film transistor formed region B, and a gate wiring and gate terminal formed region C are illustrated from the left.

First, an aluminum alloy film 21 having a film thickness of from 200 to 400 nm containing 2 at % neodymium and a molybdenum alloy film having a film thickness of from 50 to 100 nm containing from 5 to 15 at % niobium were deposited in that sequence onto a transparent substrate 1 consisting of glass to form a laminated film in which the lower layer was the aluminum alloy (Al—Nd) and the upper layer was the molybdenum alloy. Gate wiring 2, gate terminal 3 and electrostatic protection wiring 4 (not shown) were formed (first Photolithographic Process) (FIG. 15) on the laminated film using a wet etching technique which employed a phosphoric acid:nitric acid:acetic acid etchant with a photoresist formed by ordinary photolithography as a mask. The gate wiring 2, gate terminal 3 and electrostatic protection wiring 4 (not shown) had a laminated structure in which the lower layer was an aluminum alloy layer 31 and the upper layer was molybdenum alloy layer 32.

In the same manner as Example 1, because the present example is an example of forming a thin film transistor for a color TFT display device, a non-alkaline glass was employed.

Figure 16:
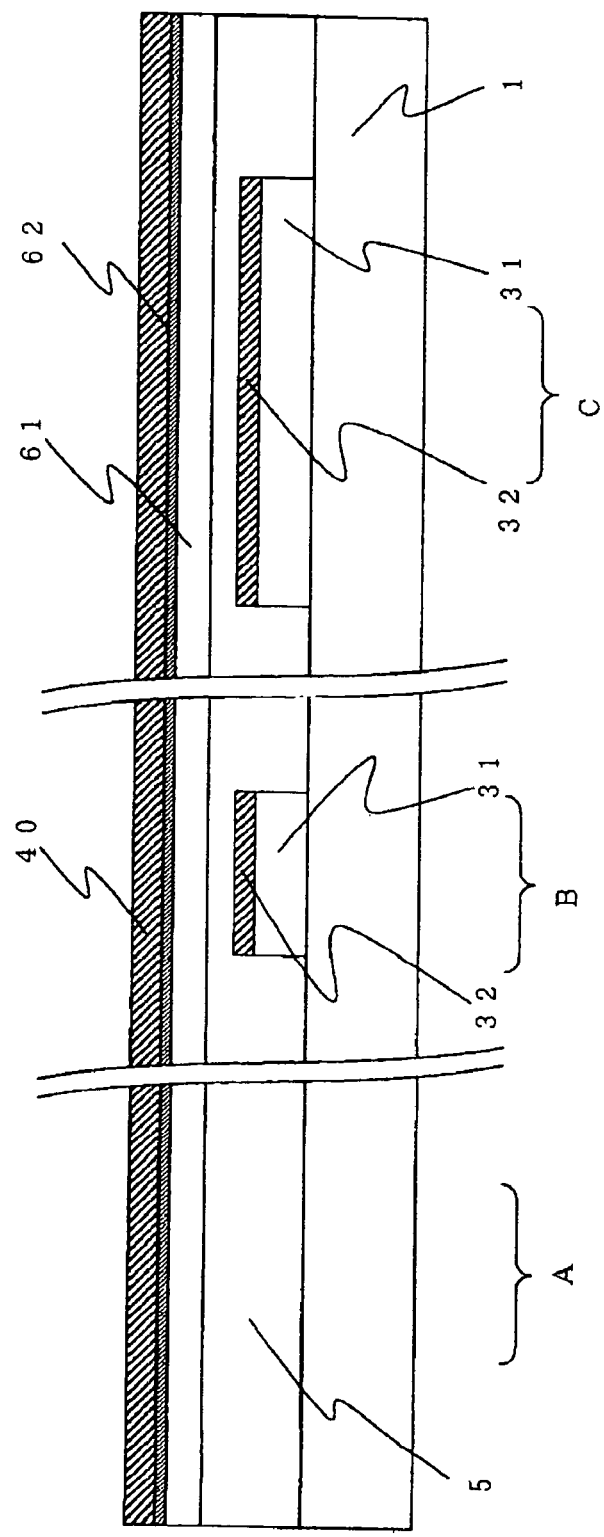
FIG. 16 is a cross-sectional view that schematically illustrates a thin film transistor substrate showing the production process following on from FIG. 15.

Next, a nitride film 5 having a film thickness of from 200 nm to 600 nm, an amorphous silicon film 61 (a-Si) having a film thickness of from 100 nm to 300 nm, an n⁺ type amorphous silicon film 62 (n⁺ type a-Si) having a film thickness of from 20 nm to 70 nm and a molybdenum alloy film 40 having a film thickness of from 200 nm to 500 nm which contained from 5 to 15 at % of niobium were deposited in that sequence (FIG. 16).

Next, resist patterns 58, 59 were formed by photolithography onto the molybdenum alloy film 40 using a graytone mask. The resist pattern 58 was formed on a formed region A of the drain wiring including the drain terminal, and the resist pattern 59 was formed on a formed region B of the thin firm transistor.

During this procedure, the resist patterns 58 and 59 are preferably formed using a halftone or a gray tone mask.

Except for the fully exposed portion and the shaded portion, the halftone or gray tone mask was a pattern having a semi-transmissive region corresponding to a channel region of the thin film transistor. As a result, the film thickness of the resist pattern 59 formed on the thin film transistor (hereinafter "TFT") formed region B had a film thickness of from 0.5 μm to 1.0 μm in the region formed by the thin film transistor channel, and a film thickness of from 1.5 μm to 2.0 μm in the other regions.

Figure 17:
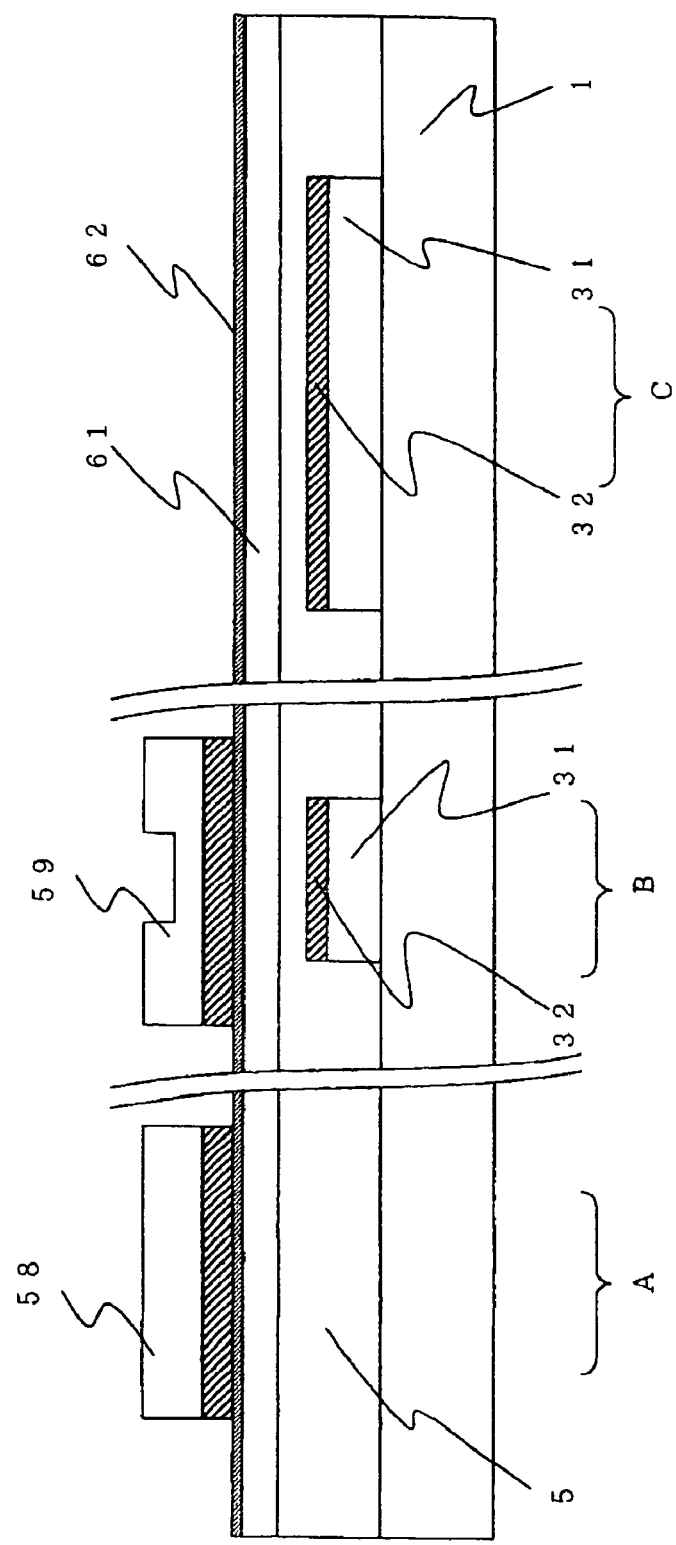
FIG. 17 is a cross-sectional view that schematically illustrates a thin film transistor substrate showing the production process following on from FIG. 16.

Next, with resist patterns 58, 59 as a mask, the molybdenum alloy (Mo—Nb) film 40 was removed by etching using an etchant of, for example, phosphoric acid:nitric acid:acetic acid (FIG. 17).

Figure 18:
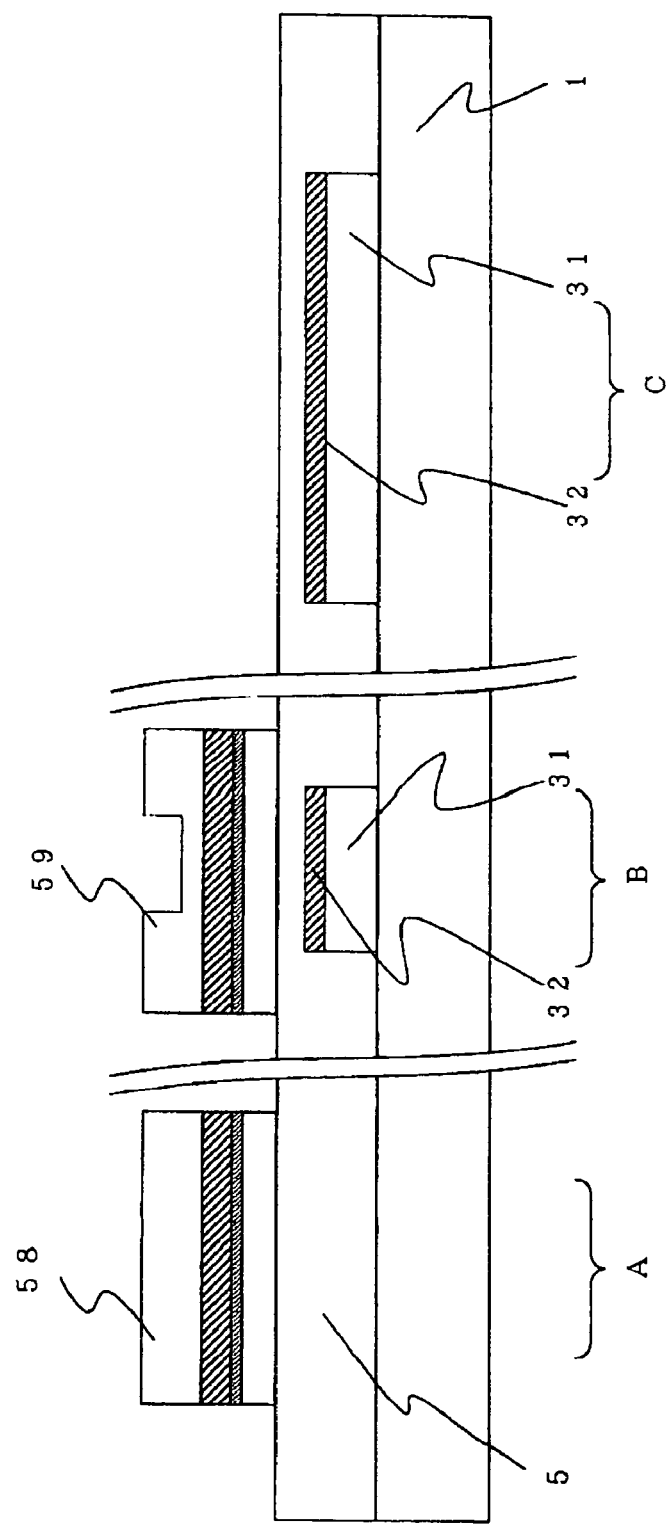
FIG. 18 is a cross-sectional view that schematically illustrates a thin film transistor substrate showing the production process following on from FIG. 17.

Next, with resist patterns 58, 59 as a mask, the n+ type a-Si film 62 and the a-Si film 61 were successively removed by dry etching (FIG. 18).

Figure 19:
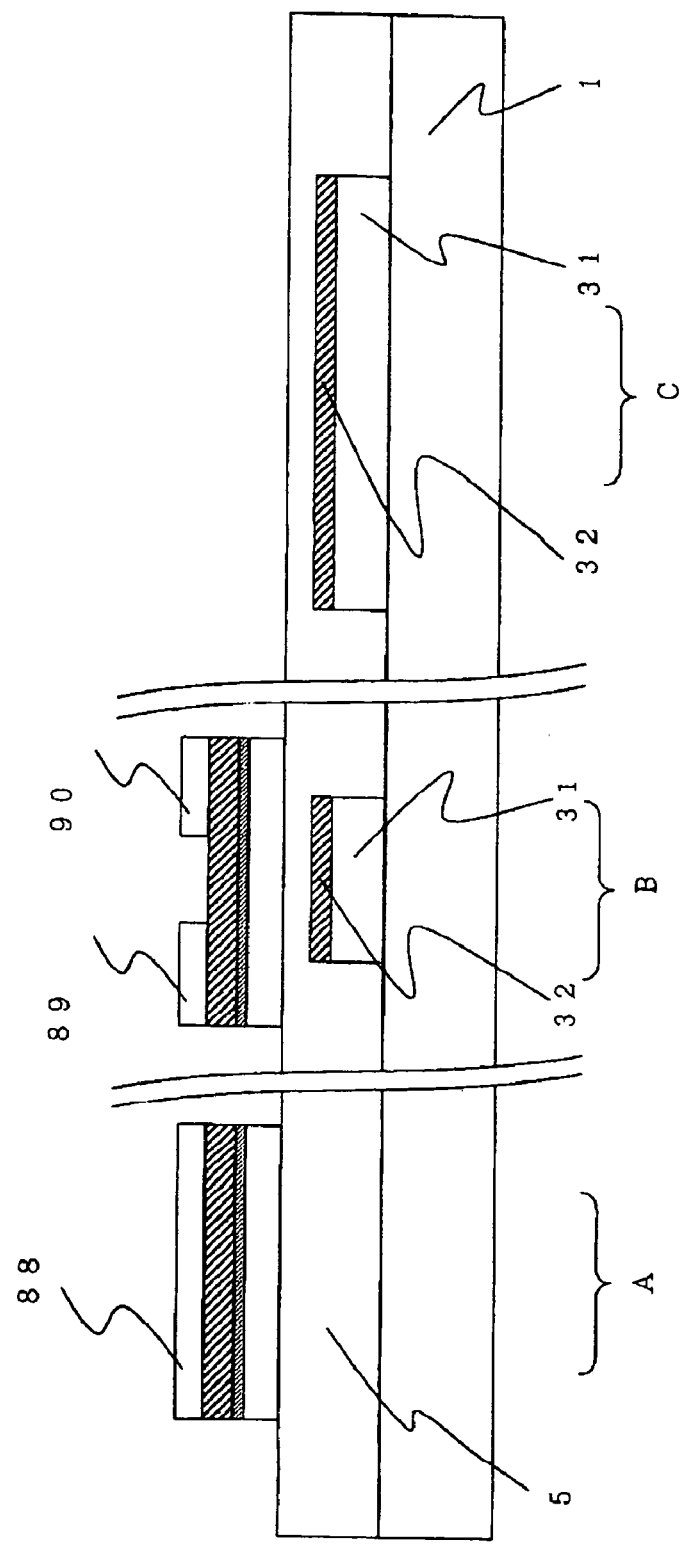
FIG. 19 is a cross-sectional view that schematically illustrates a thin film transistor substrate showing the production process following on from FIG. 18.

Next, resist patterns 58, 59 were etched in a thickness direction by oxygen plasma ashing only for the time it took to remove the thin portion corresponding to the thin film transistor channel region inside the resist pattern 59 (FIG. 19). Resist patterns 58, 59 were thus made into resist patterns 88, 89 and 90, each having a film thickness of from 0.5 μm to 1.0 μm.

Figure 20:
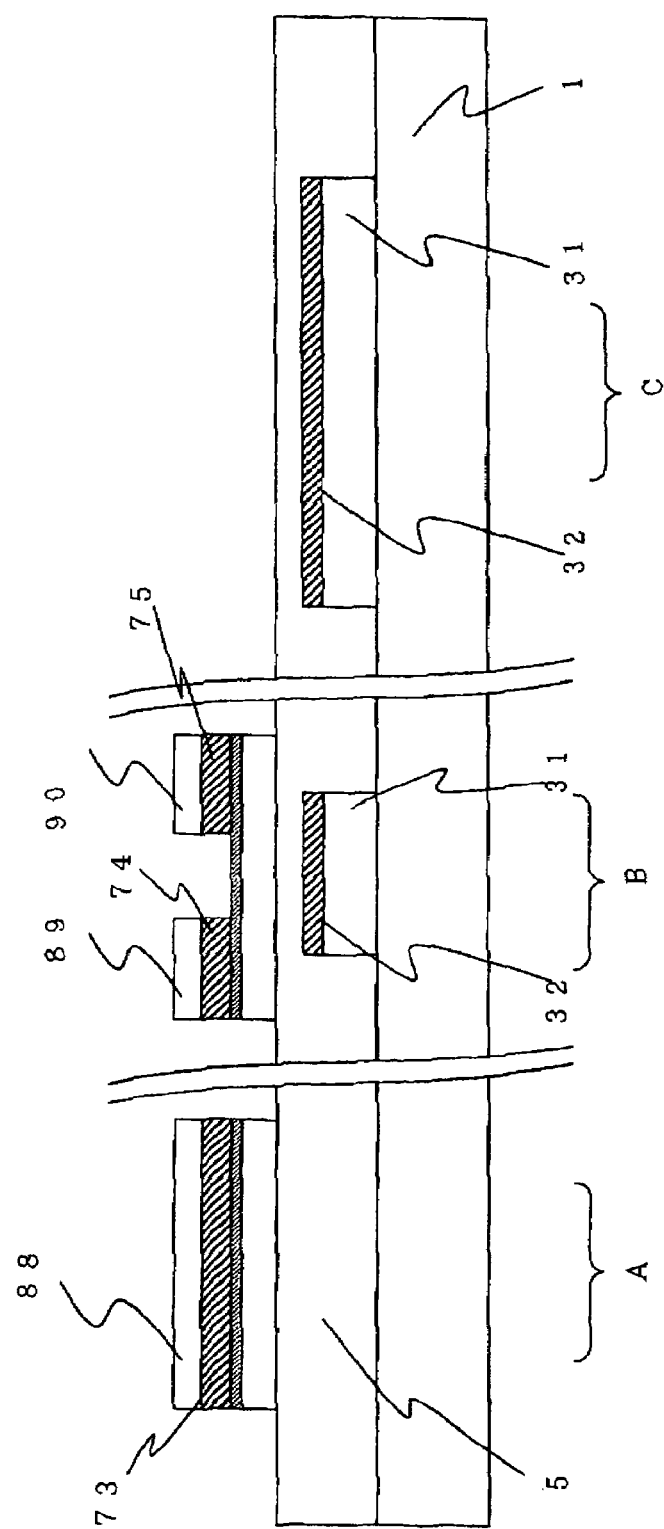
FIG. 20 is a cross-sectional view that schematically illustrates a thin film transistor substrate showing the production process following on from FIG. 19.

Next, the molybdenum alloy film 40 exposed in the thin film transistor channel region was removed by selectively dry etching with resist patterns 88, 89 and 90 as a mask to form a drain terminal shaded electrode 73, a TFT drain electrode 74 and a source electrode 75 (FIG. 20).

Figure 21:
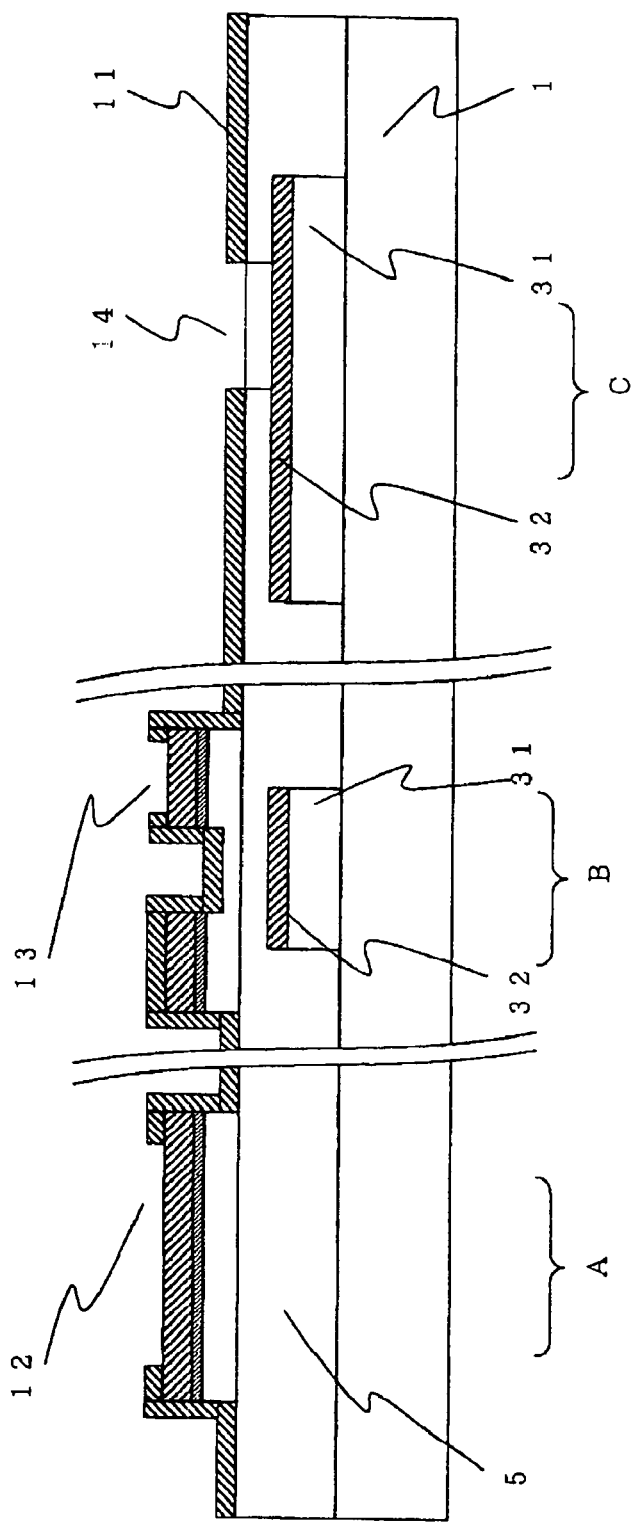
FIG. 21 is a cross-sectional view that schematically illustrates a thin film transistor substrate showing the production process following on from FIG. 20.

Next, once the resist patterns 88, 89 and 90 were removed, with the TFT drain electrode 74 and source electrode 75 as a mask, part of the n+ type a-Si film 62 and s-Si film 62 of the channel region of the thin transistor 10 were successively etched by dry etching (second Photolithographic Process). Next, a protective film 11 consisting of a nitride film having a film thickness of from 100 to 300 nm was formed on the substrate surface, and then using a photolithography process, the drain terminal, the source electrode 75 of the thin film transistor 10 and the insulating film on the gate terminal were etched to form apertures 12, 13 and 14. At this time, the apertures 12 and 13 corresponding to the drain terminal 8 and the source electrode 75 of the thin film transistor 10 were formed by the etching of the protective film 11, while the aperture 14 corresponding to the gate terminal 3 was formed by the etching of the protective film 11 and nitride film 5 (third Photolithographic Process) (FIG. 21).

Figure 22:
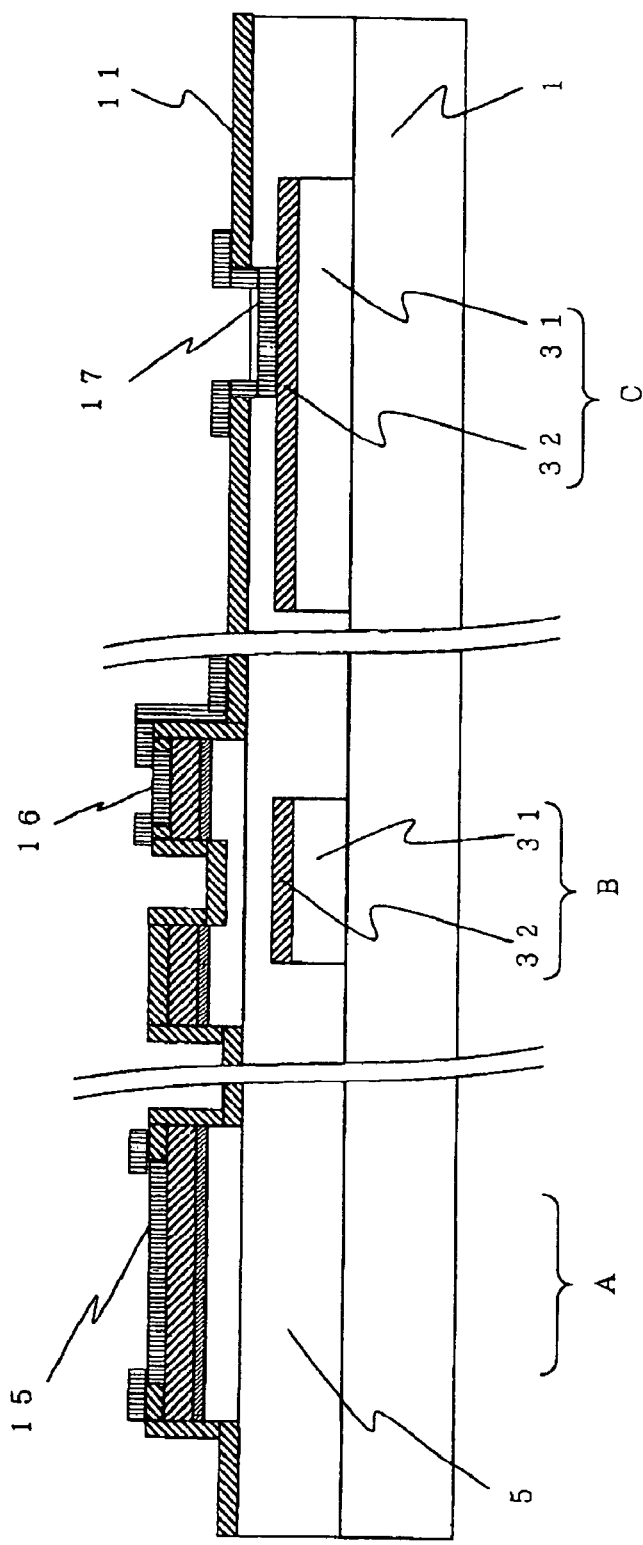
FIG. 22 is a cross-sectional view that schematically illustrates the respective cross-sections of the drain terminal, thin film transistor and gate terminal in accordance with Example 5 according to the present invention that are shown in the production process sequence of a TFT substrate.
Figure 23:
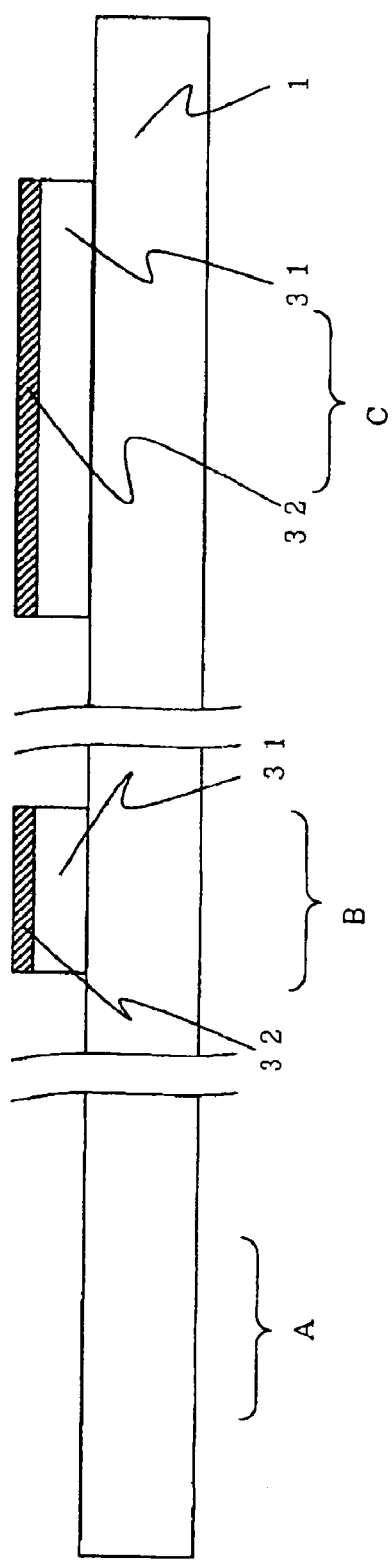
FIG. 23 is a cross-sectional view that schematically illustrates a thin film transistor substrate showing the production process following on from FIG. 22.

Finally, using a sputtering technique, an ITO (Indium Tin Oxide) film having a film thickness of from 30 to 100 nm was deposited, after which a photoresist pattern to serve as the etching mask was formed using a photolithography process. Next, the ITO film was patterned by dry etching to form a drain terminal electrode 15, a pixel electrode 16 and a gate terminal electrode 17 (fourth Photolithographic Process) (FIG. 22).

Example 5

While the above-described Examples were carried out using 4 PR, they can also be carried out using 5 PR.

FIGS. 23 to 30 are process cross-sectional diagrams that schematically show respective cross-sections of the grain terminal 8, thin film transistor 10 and the case terminal 3 according to the present example for the production process sequence of a TFT circuit device. In each diagram, a drain wiring and drain terminal formed region A, a thin film transistor formed region B, and a gate wiring and gate terminal formed region C are illustrated from the left.

First, an aluminum alloy film 21 having a film thickness of from 200 to 400 nm containing 2 at % neodymium and a molybdenum alloy film having a film thickness of from 50 to 100 nm containing from 5 to 15 at % niobium were deposited in that sequence onto a transparent substrate 1 consisting of glass to form a laminated film in which the lower layer was the aluminum alloy (Al—Nd) and the upper layer was the molybdenum alloy. Gate wiring 2, gate terminal 3 and electrostatic protection wiring 4 (not shown) were formed (first Photolithographic Process) (FIG. 23) on the laminated film using a wet etching technique which employed a phosphoric acid:nitric acid:acetic acid etchant with a photoresist formed by ordinary photolithography as a mask. The gate wiring 2, gate terminal 3 and electrostatic protection wiring 4 (not shown) had a laminated structure in which the lower layer was an aluminum alloy layer 31 and the upper layer was molybdenum alloy layer 32.

In the same manner as Example 1, because the present example is an example of forming a thin film transistor for a color TFT display device, a non-alkaline glass was employed.

Next, a nitride film 5 having a film thickness of from 200 nm to 600 nm, an amorphous silicon film 61 (a-Si) having a film thickness of from 100 nm to 300 nm, and an n+ type amorphous silicon film 62 (n+ type a-Si) having a film thickness of from 20 nm to 70 nm were deposited in that sequence.

Figure 24:
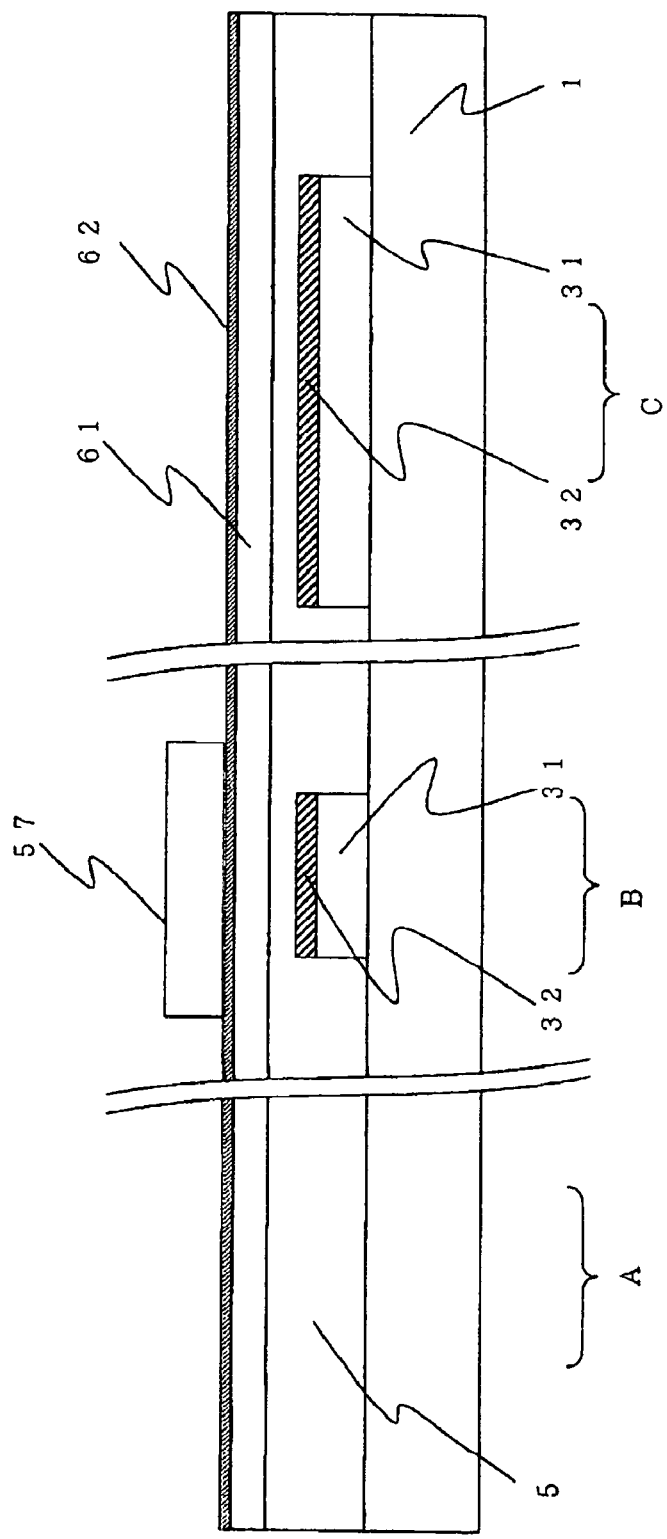
FIG. 24 is a cross-sectional view that schematically illustrates a thin film transistor substrate showing the production process following on from FIG. 23.

Next, a resist pattern 57 was formed by photolithography onto the amorphous silicon (n− type a-Si) film 62 (FIG. 24). With the resist pattern 57 as a mask, the n+ type amorphous silicon (n+ type a-Si) film 62 and the amorphous silicon film 61 were removed by dry etching (second PR stage).

Figure 25:
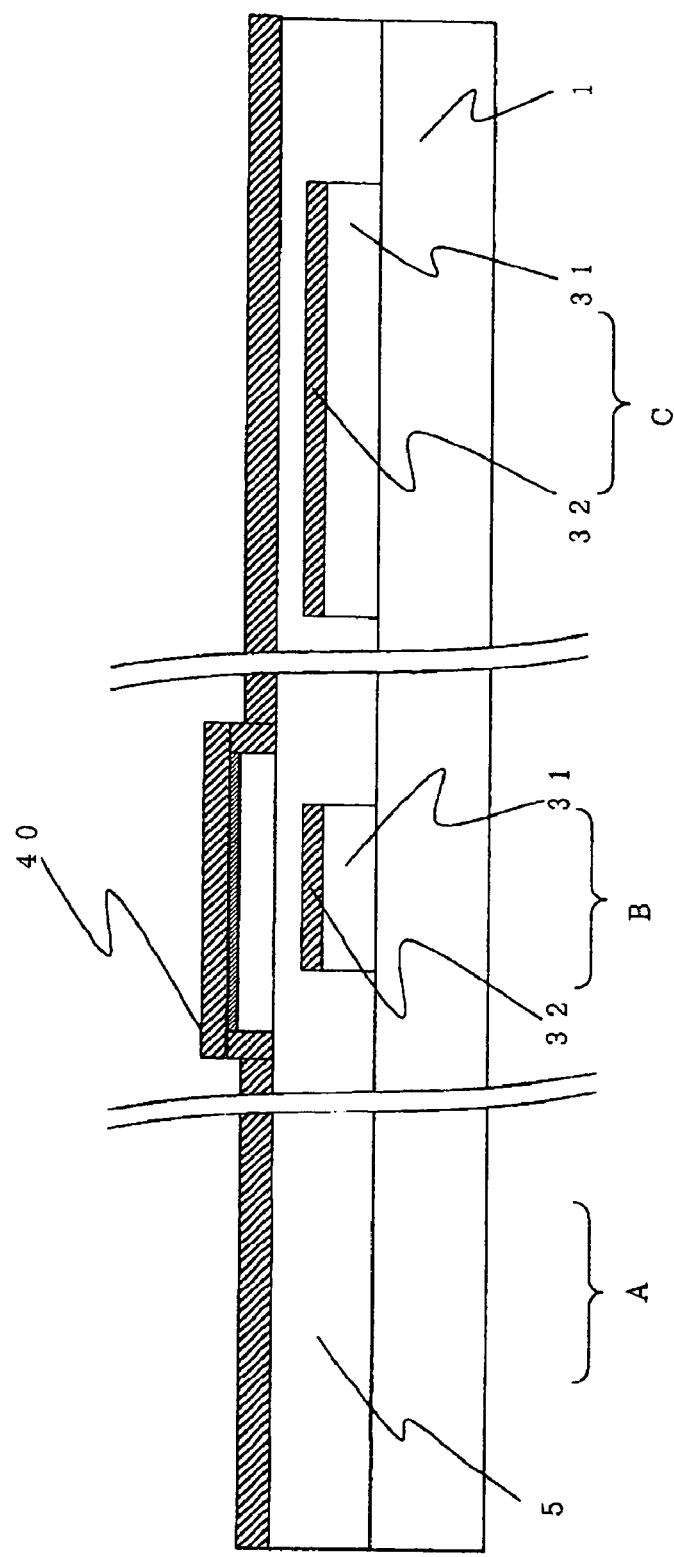
FIG. 25 is a cross-sectional view that schematically illustrates a thin film transistor substrate showing the production process following on from FIG. 24.

Next, after resist pattern 57 was removed, a molybdenum alloy (Mo—Nb) film 40 was formed having a film thickness of from 200 nm to 500 nm containing from 5 to 15 at % of niobium (FIG. 25).

Figure 26:
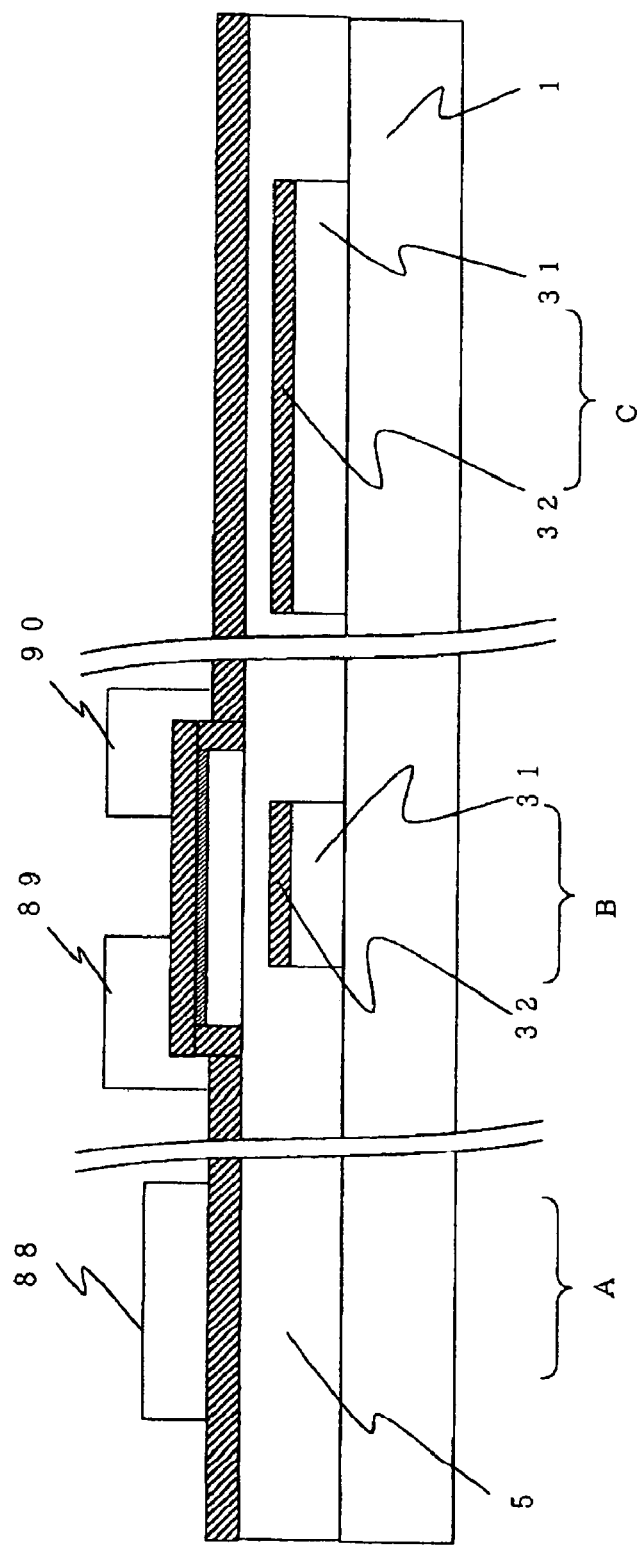
FIG. 26 is a cross-sectional view that schematically illustrates a thin film transistor substrate showing the production process following on from FIG. 25.

Next, resist patterns 88, 89 and 90 were formed by photolithograohy onto the molybdenum alloy film 40. The resist pattern 88 was formed on a drain wiring region A that included a drain terminal, and the resist patterns 89 and 90 were formed on a thin film transistor formed region B (FIG. 26).

Figure 27:
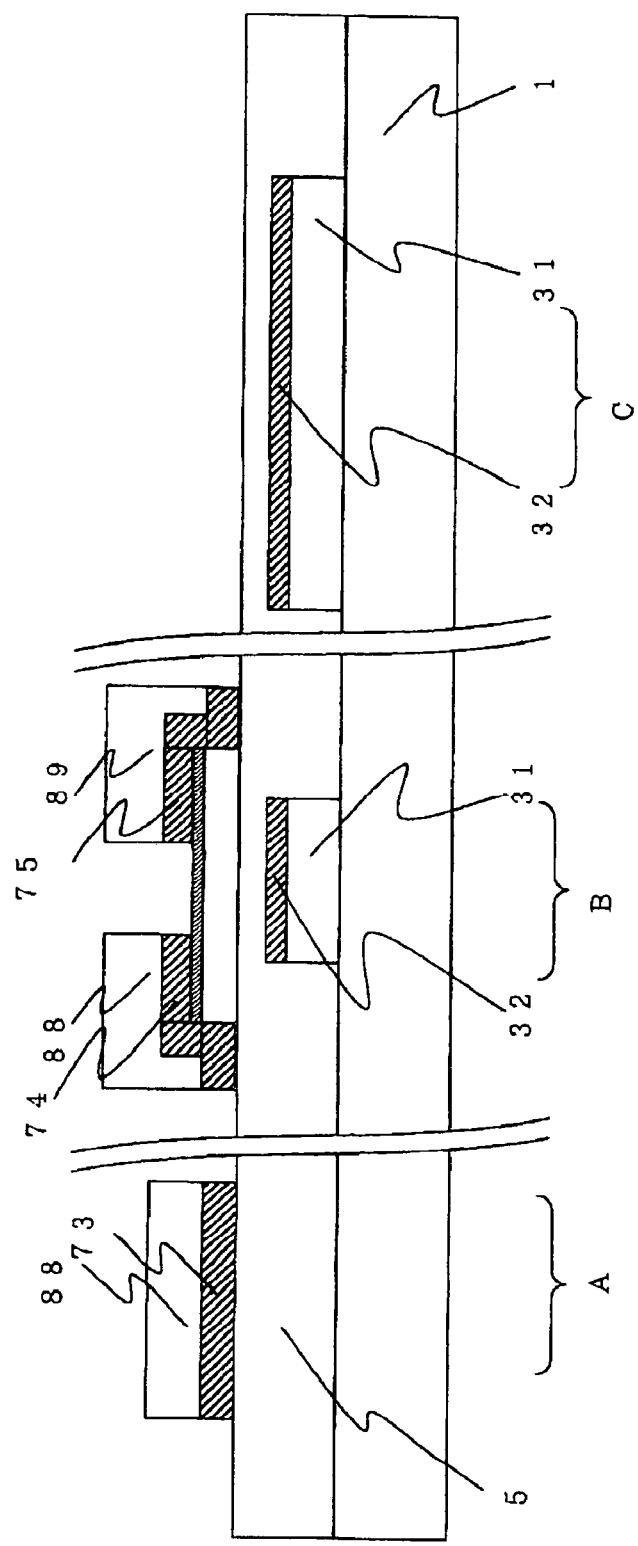
FIG. 27 is a cross-sectional view that schematically illustrates a thin film transistor substrate showing the production process following on from FIG. 26.

Next, with resist patterns 88, 89 and 90 as a mask, the molybdenum alloy film 40 was removed by etching using an etchant of, for example, phosphoric acid:nitric acid:acetic acid (FIG. 27)

Figure 28:
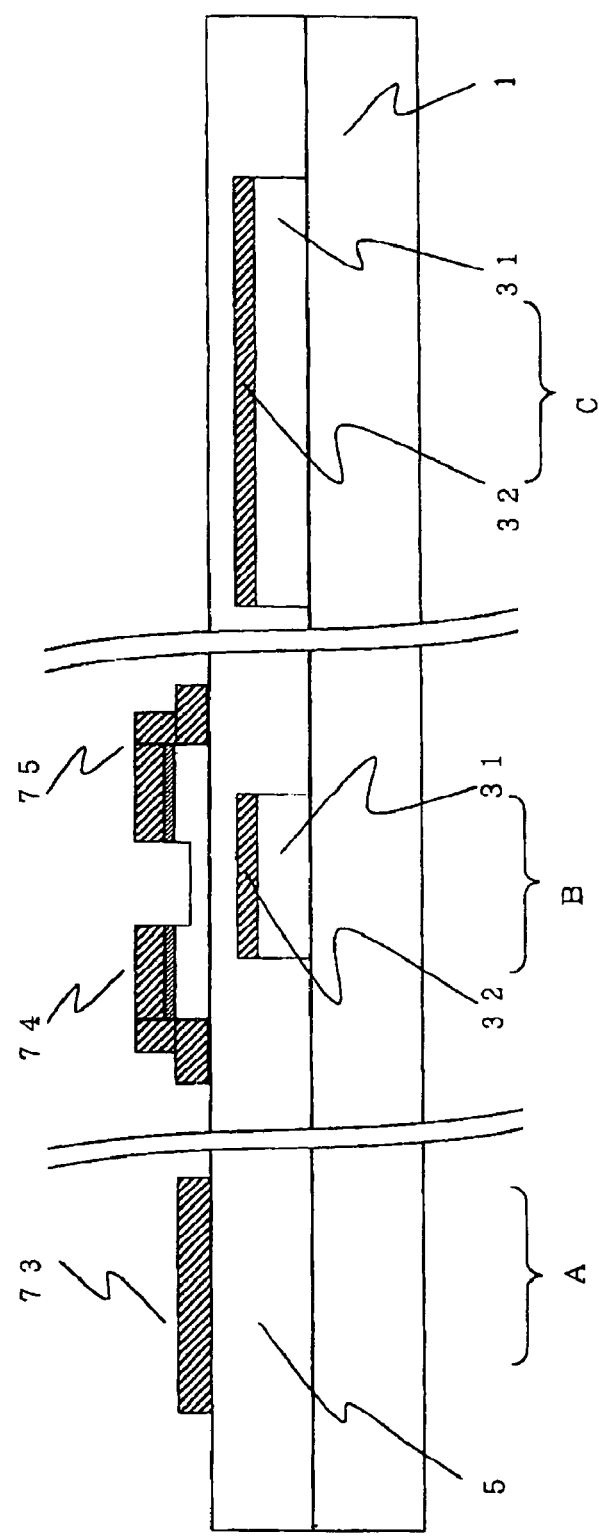
FIG. 28 is a cross-sectional view that schematically illustrates a thin film transistor substrate showing the production process following on from FIG. 27.

Next, the molybdenum alloy film 40 exposed in the thin film transistor channel region was removed by selectively dry etching with resist patterns 88, 89 and 90 as a mask to form a drain terminal shaded electrode 73, a TFT drain electrode 74 and a source electrode 75 (third Photolithographic Process) (FIG. 28).

Next, the resist patterns 88, 89 and 90 were removed, and then with the drain terminal, drain electrode and source electrode as a mask, part of the n+ type a-Si film 61 and a-Si film 62 were removed in a thickness direction. Next, a protective film 11, consisting of a nitride film having a film thickness of from 100 to 300 nm, was formed on the substrate surface, and then using a photolithography process, the drain terminal, the source electrode 75 of the thin film transistor 10 and the insulating film on the gate terminal were etched to form apertures 12, 13 and 14 (fourth Photolithographic Process) (FIG. 29). At this time, the apertures 12 and 13 corresponding to the drain terminal 8 and the source electrode 75 of the thin film transistor 10 were formed by the etching of the protective film 11, while the aperture 14 corresponding to the gate terminal 3 was formed by the etching of the protective film 11 and nitride film 5.

Finally, using a sputtering technique, an ITO (Indium Tin Oxide) film having a film thickness of from 30 to 100 nm was deposited, after which a photoresist pattern to serve as the etching mask was formed using a photolithography process. Next, the ITO film was patterned by dry etching to form a drain terminal electrode 15, a pixel electrode 16 and a gate terminal electrode 17 (fifth Photolithographic Process) (FIG. 30).

Example 6

The aluminum alloy is required to be completely removed during wet etching. While an Al—Si alloy containing silicon can be completely removed by dry etching, for wet etching a thin layer remains on the surface, and is thus not preferable.

Needless to say, impurities other than neodymium that can be completely removed by wet etching may also be contained.

Pure aluminum or neodymium are preferably used for the reason that they can be completely removed by wet etching.

Needless to say, apart from pure aluminum or an aluminum alloy, silver alloys having silver as a main constituent or copper alloys having copper as a main constituent can also be used as long as they can be completely removed by wet etching.

In addition, while the above-described Examples were explained with reference to a TFT structure of a out-plane type liquid crystal display, the same effects as those of the above-described Examples would be achieved even for a TFT structure having a different liquid crystal control method, such as in-plane type, was used.

A first substrate formed by the thin film transistor circuit device according to the present invention can face, for example, a second substrate formed from common wiring wherein a liquid crystal display is formed by sandwiching the liquid crystal in the gap.

What is claimed is:

1. A method of forming a thin film transistor circuit device comprising a thin film transistor and a wiring which is formed in a main circuit region formed on a center of a substrate and an outer circuit region formed on an outer periphery of the substrate, the method comprising:

forming an insulating film on the electrode of the thin film transistor or the wiring;

exposing a surface of an uppermost layer of the electrode of the thin film transistor or the wiring at a via aperture formed on the insulating film at the thin film transistor or the wiring; and forming a wiring between the via apertures, wherein said exposed surface of the uppermost layer of the electrode of the thin film transistor or the wiring is a molybdenum alloy comprising niobium.

2. A method of forming a thin film transistor circuit device according to claim 1, wherein oxidizing said exposed surface of the uppermost layer of the electrode of the thin film transistor or the wiring follows after the exposing a surface of the uppermost layer of the electrode of the thin film transistor or the wiring at the via aperture formed on the insulating film at the thin film transistor or the wiring.

3. A method of forming a thin film transistor circuit device according to claim 1, wherein the forming a wiring between the via apertures comprises sputtering with oxygen containing atmosphere.

* * * * *